United States Patent
Tsai et al.

(10) Patent No.: US 11,450,654 B2
(45) Date of Patent: Sep. 20, 2022

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Tsung-Fu Tsai, Changhua County (TW); Chin-Fu Kao, Taipei (TW); Pu Wang, Hsinchu (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 119 days.

(21) Appl. No.: 16/925,326

(22) Filed: Jul. 9, 2020

(65) Prior Publication Data
US 2021/0202455 A1 Jul. 1, 2021

Related U.S. Application Data

(60) Provisional application No. 62/953,488, filed on Dec. 25, 2019.

(51) Int. Cl.
*H01L 21/50* (2006.01)
*H01L 25/18* (2006.01)

(52) U.S. Cl.
CPC .............. *H01L 25/18* (2013.01); *H01L 21/50* (2013.01)

(58) Field of Classification Search
CPC ............ H01L 25/18; H01L 21/50; H01L 2221/68345; H01L 2221/68368; H01L 2221/68372; H01L 21/6835; H01L 25/0655; H01L 25/16; H01L 25/50; H01L 23/10
See application file for complete search history.

(56) References Cited

U.S. PATENT DOCUMENTS

| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |

(Continued)

FOREIGN PATENT DOCUMENTS

EP 2375446 10/2014

OTHER PUBLICATIONS

Office Action of Taiwan Counterpart Application, dated Jul. 5, 2021, pp. 1-4.

*Primary Examiner* — Elias Ullah
(74) *Attorney, Agent, or Firm* — JCIPRNET

(57) ABSTRACT

A package structure includes a circuits substrate, a semiconductor package, a lid structure and a plurality of first spacer structures. The semiconductor package is disposed on and electrically connected to the circuit substrate. The lid structure is disposed on the circuit substrate covering the semiconductor package, wherein the lid structure is attached to the circuit substrate through an adhesive material. The plurality of first spacer structures is surrounding the semiconductor package, wherein the first spacer structures are sandwiched between the lid structure and the circuit substrate, and includes a top portion in contact with the lid structure and a bottom portion in contact with the circuit substrate.

20 Claims, 29 Drawing Sheets

(56) References Cited

U.S. PATENT DOCUMENTS

| | | |
|---|---|---|
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2012/0049347 A1* | 3/2012 | Wang ............... H01L 25/0657 |
| | | 257/737 |
| 2018/0348434 A1 | 12/2018 | Yim et al. |

* cited by examiner

PACKAGE STRUCTURE AND METHOD OF FABRICATING THE SAME

CROSS-REFERENCE TO RELATED APPLICATION

This application claims the priority benefit of U.S. provisional application Ser. No. 62/953,488, filed on Dec. 25, 2019. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
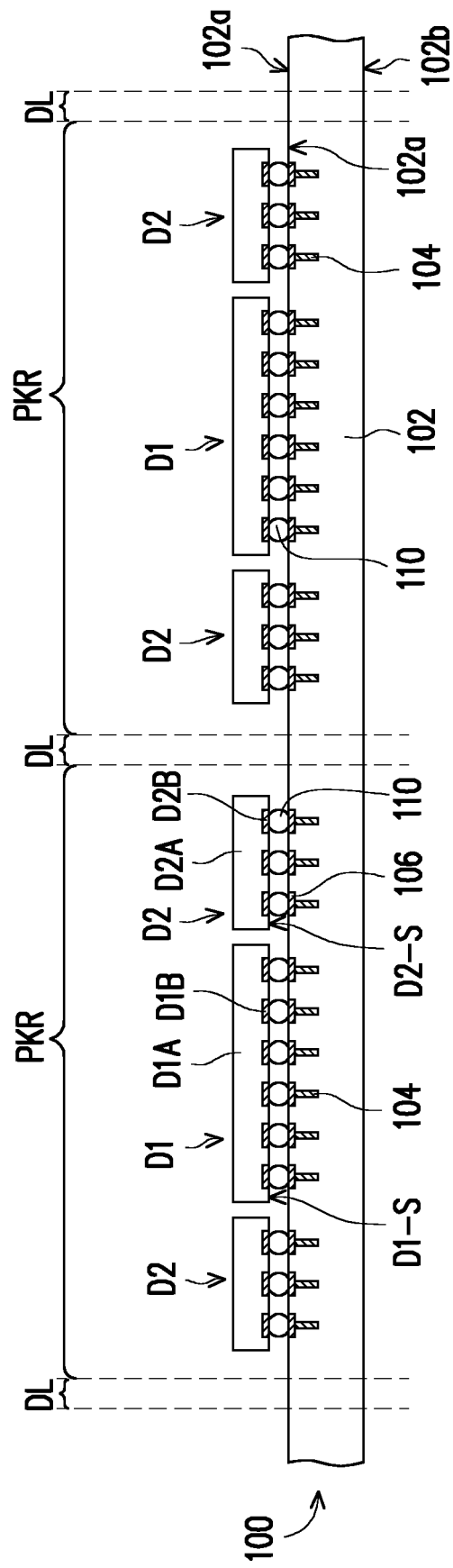
FIG. 1A to FIG. 1H are schematic sectional views of various stages in a method of fabricating a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic sectional views of various stages in a method of fabricating a semiconductor package according to some exemplary embodiments of the present disclosure. Referring to FIG. 1A, an interposer structure 100 is provided. In some embodiments, the interposer structure 100 includes a core portion 102, and a plurality of through vias 104 and conductive pads 106 formed therein. In some embodiments, the core portion 102 may be a substrate such as a bulk semiconductor substrate, silicon on insulator (SOI) substrate or a multi-layered semiconductor material substrate. The semiconductor material of the substrate (core portion 102) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core portion 102 may be doped or undoped.

In some embodiments, the conductive pads 106 are formed on a first surface 102a of the core portion 102. In some embodiments, through vias 104 are formed in the core portion 102 and connected with the conductive pads 106. In some embodiments, the through vias 104 extend into the core portion 102 with a specific depth. In some embodiments, the through vias 104 are through-substrate vias. In some embodiments, the through vias 104 are through-silicon vias when the core portion 102 is a silicon substrate. In some embodiments, the through vias 104 may be formed by forming holes or recesses in the core portion 102 and then filling the recesses with a conductive material. In some embodiments, the recesses may be formed by, for example, etching, milling, laser drilling or the like. In some embodiments, the conductive material may be formed by an electrochemical plating process, chemical vapor deposition (CVD), atomic layer deposition (ALD) or physical vapor deposition (PVD), and the conductive material may include copper, tungsten, aluminum, silver, gold or a combination thereof. In some embodiments, the conductive pads 106 connected with the through vias 104 may be formed as conductive parts of the redistribution layer(s) formed on the interposer structure 100. In some embodiments, the conductive pads 106 include under bump metallurgies (UBMs). In certain embodiments, the interposer structure 100 may further include active or passive devices, such as transistors, capacitors, resistors, or diodes passive devices formed in the core portion 102.

As illustrated in FIG. 1A, the core portion 102 has a plurality of package regions PKR and a dicing lane DL separating each of the plurality of package regions PKR. The through vias 104 and conductive pads 106 are formed in the core portion 102 within the package regions PKR. In some embodiments, the semiconductor dies D1 and semiconductor dies D2 are provided on the interposer structure 100, or on the core portion 102 within the package regions PKR. The semiconductor dies D1 and semiconductor dies D2 are individual dies singulated from a wafer. In some embodiments, the semiconductor dies D1 contain the same circuitry, such as devices and metallization patterns, or the semiconductor dies D1 are the same type of dies. In some embodiments, the semiconductor dies D2 contain the same circuitry, or the semiconductor dies D2 are the same type of dies. In certain embodiments, the semiconductor dies D1 and the semiconductor dies D2 have different circuitry or are different types of dies. In alternative embodiments, the semiconductor dies D1 and the semiconductor dies D2 may have the same circuitry.

In some embodiments, the semiconductor dies D1 may be major dies, while the semiconductor dies D2 are tributary dies. In some embodiments, the major dies are arranged on the core portion 102 in central locations of each package region PKR, while tributary dies are arranged side-by-side and spaced apart from the major dies. In some embodiments, the tributary dies are arranged aside the major dies, and around or surrounding the major dies. In one embodiment, four or six tributary dies are arranged around one major die per one package region PKR. The disclosure is not limited thereto.

In certain embodiments, the semiconductor dies D1 has a surface area larger than that of the semiconductor dies D2. Also, in some embodiments, the semiconductor dies D1 and the semiconductor dies D2 may be of different sizes, including different surface areas and/or different thicknesses. In some embodiments, the semiconductor dies D1 may be a logic die, including a central processing unit (CPU) die, graphics processing unit (GPU) die, system-on-a-chip (SoC) die, a microcontroller or the like. In some embodiments, the semiconductor dies D1 is a power management die, such as a power management integrated circuit (PMIC) die. In some embodiments, the semiconductor dies D2 may be a memory die, including dynamic random access memory (DRAM) die, static random access memory (SRAM) die or a high bandwidth memory (HBM) die. The disclosure is not limited thereto, and the number, sizes and types of the semiconductor die disposed on the core portion 102 may be appropriately adjusted based on product requirement.

In the illustrated embodiment, the semiconductor dies D1 include a body D1A and connecting pads D1B formed on an active surface D1-S of the body D1A. In certain embodiments, the connecting pads D1B may further include pillar structures for bonding the semiconductor dies D1 to other structures. In some embodiments, the semiconductor dies D2 include a body D2A and connecting pads D2B formed on an active surface D2-S of the body D2A. In other embodiments, the connecting pads D2B may further include pillar structures for bonding the dies D2 to other structures.

In some embodiments, the semiconductor dies D1 and the semiconductor dies D2 are attached to the first surface 102a of the core portion 102, for example, through flip-chip bonding by way of the electrical connectors 110. Through the reflow process, the electrical connectors 110 are formed between the connecting pads D1A, D2B and conductive pads 106, electrically and physically connecting the semiconductor dies D1, D2 to the core portion 102 of the interposer structure 100. In some embodiments, the electrical connectors 110 are located in between the semiconductor dies D1, D2 and the interposer structure 100. In certain embodiments, semiconductor dies D1, D2 are electrically connected to the through vias 104 and the conductive pads 106 through the electrical connectors 110. In one embodiment, the electrical connectors 110 are micro-bumps, such as micro-bumps having copper metal pillars. In another embodiment, the electrical connectors 110 are solder bumps, lead-free solder bumps, or micro bumps, such as controlled collapse chip connection (C4) bumps or micro bumps containing copper pillars. In some embodiments, the bonding between the semiconductor dies D1, D2 and the core portion 102 may be solder bonding. In some embodiments, the bonding between the semiconductor dies D1, D2 and the core portion 102 may be direct metal-to-metal bonding, such as copper-to-copper bonding.

Figure 1B:
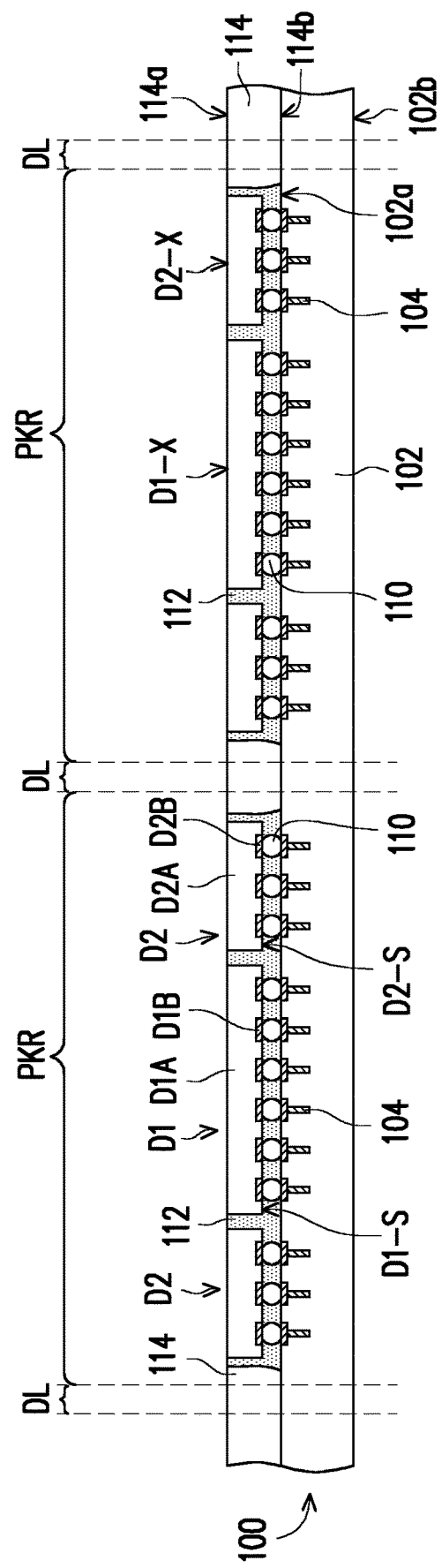

Referring to FIG. 1B, in a next step, an underfill structure 112 may be formed to cover the plurality of electrical connectors 110, and to fill up the spaces in between the semiconductor dies DE D2 and the interposer structure 100. In some embodiments, the underfill structure 112 further cover side walls of the semiconductor dies D1, D2, and is located within the package region PKR. Thereafter, an insulating encapsulant 114 may be formed over the interposer structure 100 (or over the core portion 102) to cover the underfill structure 112, and to surround the semiconductor dies D1 and D2.

In some embodiments, the insulating encapsulant 114 is formed on the first surface 102a of the core portion 102 in the package regions PKR and over the dicing lanes DL. In some embodiments, the insulating encapsulant 114 is formed through, for example, a compression molding process or transfer molding. In one embodiment, a curing process is performed to cure the insulating encapsulant 114. In some embodiments, the semiconductor dies DE D2 and the electrical connectors 110 are encapsulated by the insulating encapsulant 114. In some embodiments, a planarization process, including grinding or polishing, may be performed to partially remove the insulating encapsulant 114, exposing backside surfaces D1-X, D2-X of the semiconductor dies D1, D2. Accordingly, the backside surfaces D1-X, D2-X of the semiconductor dies D1, D2 are levelled with a top surface 114a of the insulating encapsulant 114. The top surface 114a being opposite to a backside surface 114b of the insulating encapsulant 114, wherein the backside surface 114b is in contact with the core portion 102.

In some embodiments, a material of the insulating encapsulant 114 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 114 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 114. The disclosure is not limited thereto.

Figure 1C:
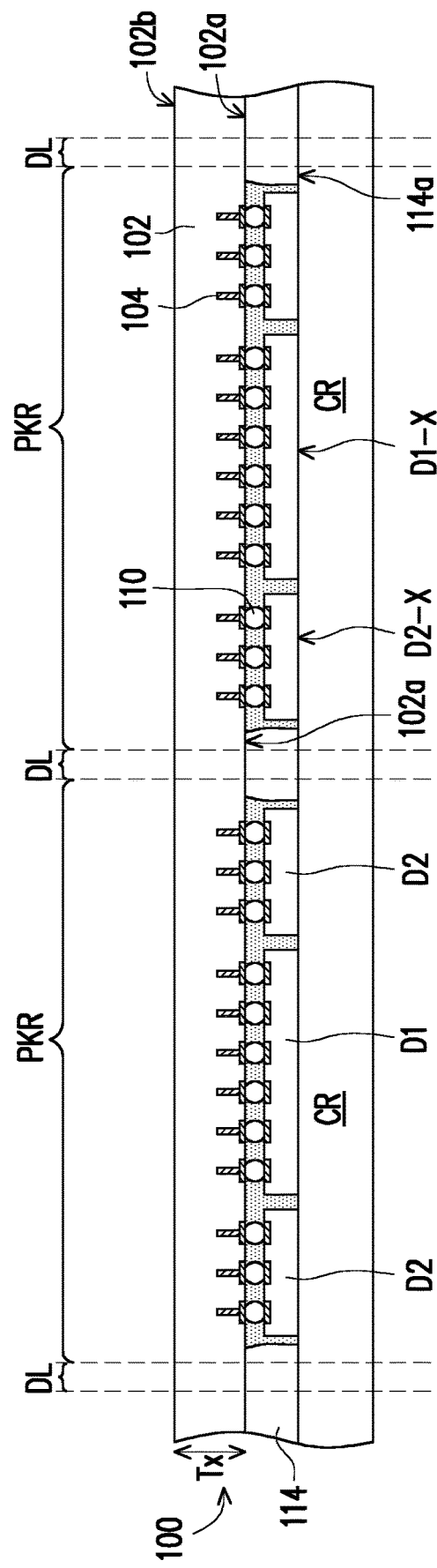

Referring to FIG. 1C, the structure of FIG. 1B is turned upside down or flipped, and placed on a carrier CR, so that the carrier CR directly contacts the backside surfaces D1-X, D2-X of the semiconductor dies DE D2 and the top surface 114a of the insulating encapsulant 114. As shown in FIG. 1C, at this stage of processing, the interposer structure 100 has not been thinned and has a thickness Tx. In other words, the through vias 104 are not revealed, and are embedded in the core portion 102 of the interposer structure 100.

Figure 1D:
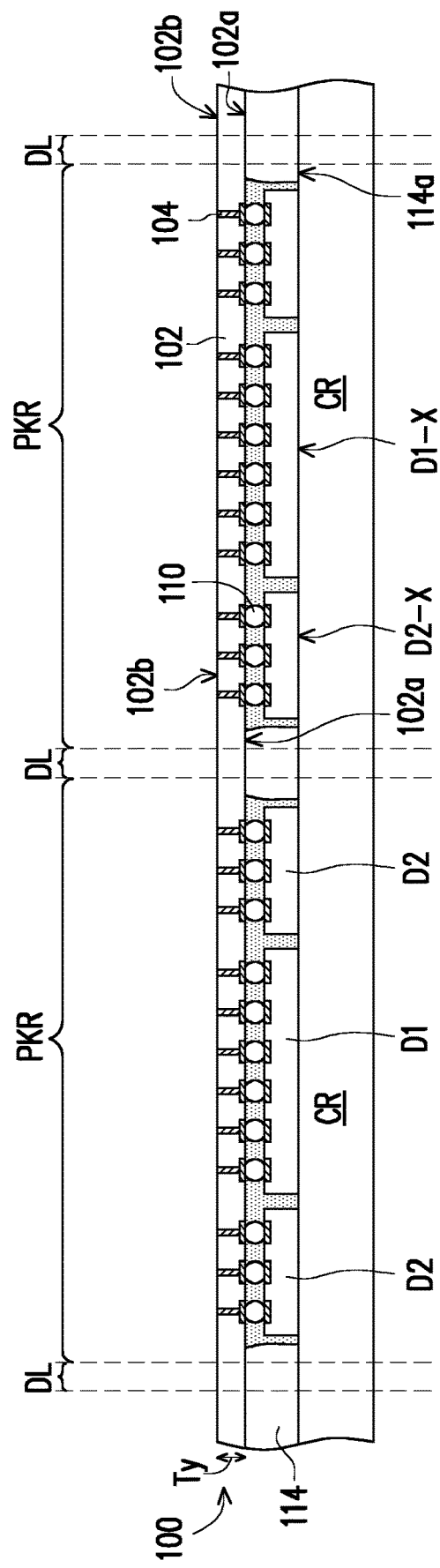

Referring to FIG. 1D, a thinning process is performed to the interposer 100 to partially remove or thin the core portion 102 of the interposer structure 100 until the through vias 104 are exposed and a second surface 102b of the core portion 102 is formed. In some embodiments, the thinning process may include a back-grinding process, a polishing process or an etching process. In some embodiments, after the thinning process, the interposer structure 100 is thinned to a thickness Ty. In some embodiments, a ratio of the thickness Ty to the thickness Tx ranges from about 0.1 to about 0.5.

Figure 1E:
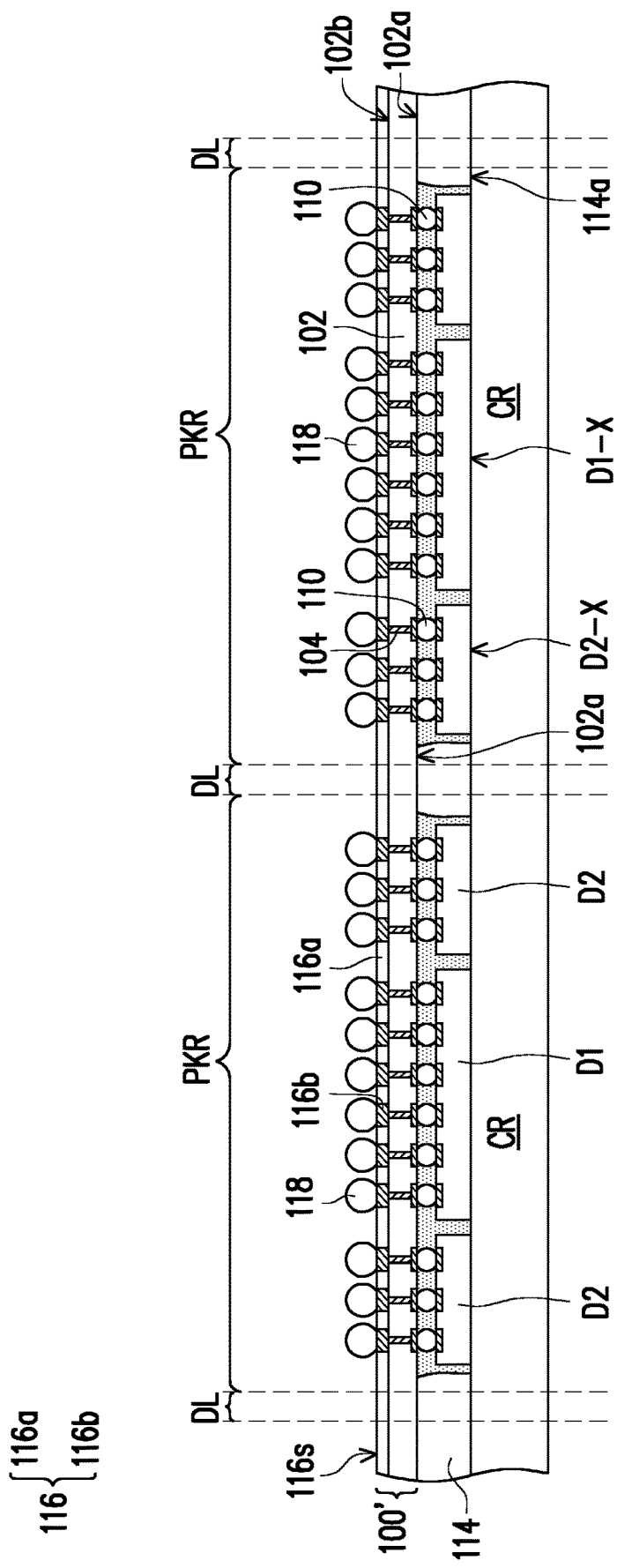

Referring to FIG. 1E, a redistribution structure 116 is formed on the second surface 102b of the core portion 102 in the package region PKR and over the dicing lanes DL. The second surface 102b being opposite to a first surface 102a of the core portion 102. In some embodiments, the redistribution structure 116, the core portion 102, the through vias 104 and conductive pads 106 constitutes the interposer structure 100'. In some embodiments, the redistribution structure 116 electrically connects the through vias 104 and/or electrically connects the through vias 104 with external devices. In certain embodiments, the redistribution structure 116 includes at least one dielectric layer 116a and metallization patterns 116b in the dielectric layer 116a. In some embodiments, the metallization patterns 116b may comprise pads, vias and/or trace lines to interconnect the through vias 104 and to further connect the through vias 104 to one or more external devices. Although one layer of dielectric layer 116a, and one layer of the metallization patterns 116b is shown in FIG. 1E, it should be noted that the number of layers of the dielectric layer 116a and the metallization patterns 116b is not limited thereto, and this could be adjusted based on requirement.

In some embodiments, the material of the dielectric layer 116a comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 116a may be formed by spin-coating or deposition, including chemical vapor deposition (CVD), PECVD, HDP-CVD, or the like. In some embodiments, the metallization patterns 116b include under-metal metallurgies (UBMs). In some embodiments, the formation of the metallization patterns 116b may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 116b includes copper, aluminum, tungsten, silver, and combinations thereof.

As illustrated in FIG. 1E, a plurality of conductive terminals 118 is disposed on the metallization patterns 116b, and are electrically coupled to the through vias 104. In some embodiments, the conductive terminals 118 are placed on the top surface 116s of the redistribution structure 116, and electrically connected to the through vias 104 by the metallization patterns 116b within the package region PKR. In certain embodiments, the conductive terminals 118 are positioned on and physically attached to the metallization patterns 116b. In some embodiments, the conductive terminals 118 include lead-free solder balls, solder balls, ball grid array (BGA) balls, bumps, C4 bumps or micro bumps. In some embodiments, the conductive terminals 118 may include a conductive material such as solder, copper, aluminum, gold, nickel, silver, palladium, tin, or a combination thereof. In some embodiments, the conductive terminals 118 are formed by forming the solder paste on the redistribution structure 116 by, for example, evaporation, electroplating, printing or solder transfer and then reflowed into the desired bump shapes. In some embodiments, the conductive terminals 118 are placed on the redistribution structure 116 by ball placement or the like. In other embodiments, the conductive terminals 118 are formed by forming solder-free metal pillars (such as a copper pillar) by sputtering, printing, electroless or electro plating or CVD, and then forming a lead-free cap layer by plating on the metal pillars. The conductive terminals 118 may be used to bond to an external device or an additional electrical component. In some embodiments, the conductive terminals 118 are used to bond to a circuit substrate, a semiconductor substrate or a packaging substrate.

Figure 1F:
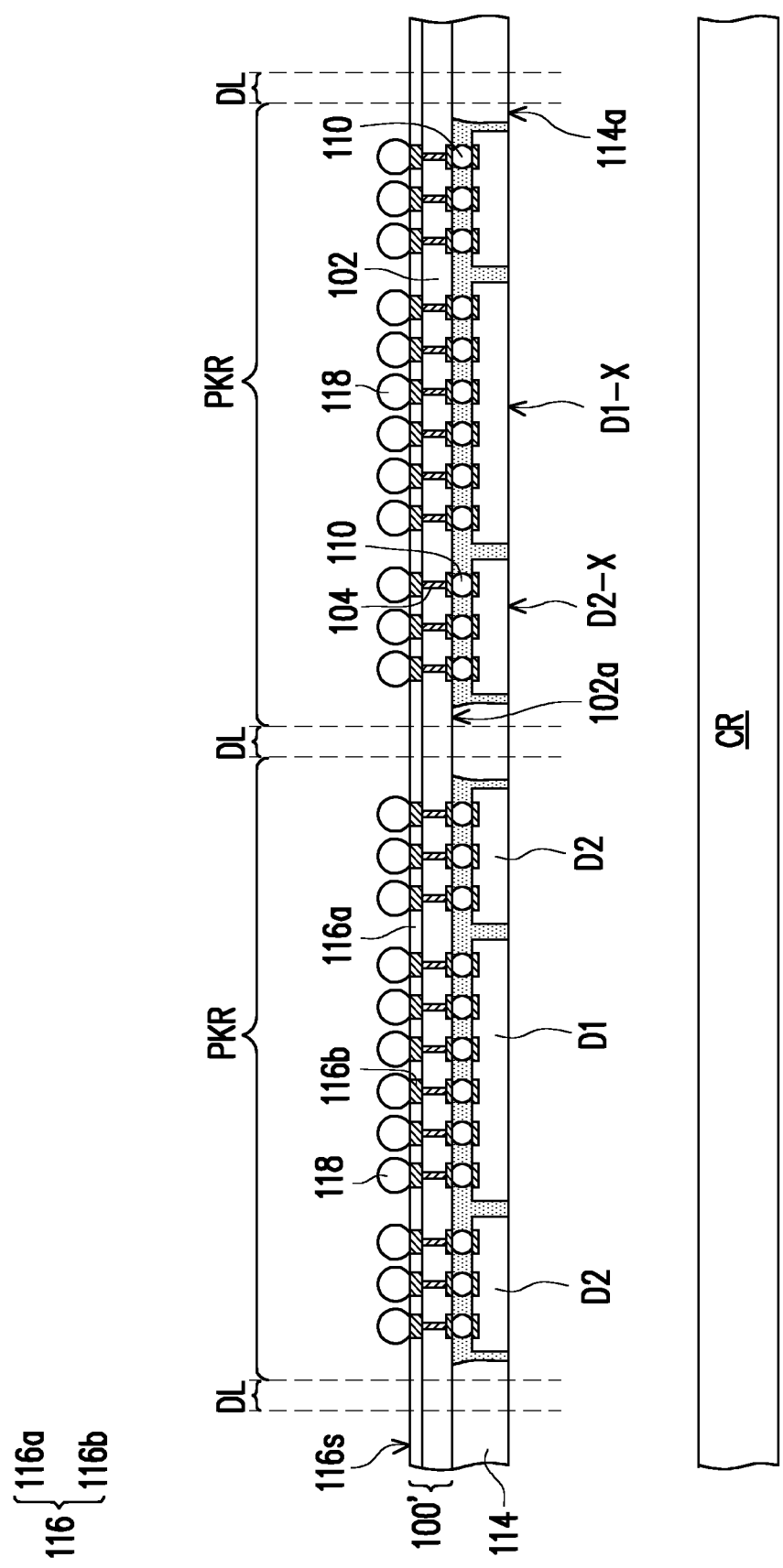

Referring to FIG. 1F, in a subsequent step, the carrier CR is de-bonded. For example, the de-bonding process includes projecting a light such as a laser light or an UV light on a debond layer (e.g., light-to-heat-conversion release layer) that is attached to the carrier CR (not shown), so that the carrier CR can be easily removed along with the debond layer. In some embodiments, the backside surfaces D1-X, D2-X of the semiconductor dies D1, D2 are revealed after the de-bonding process.

Figure 1G:
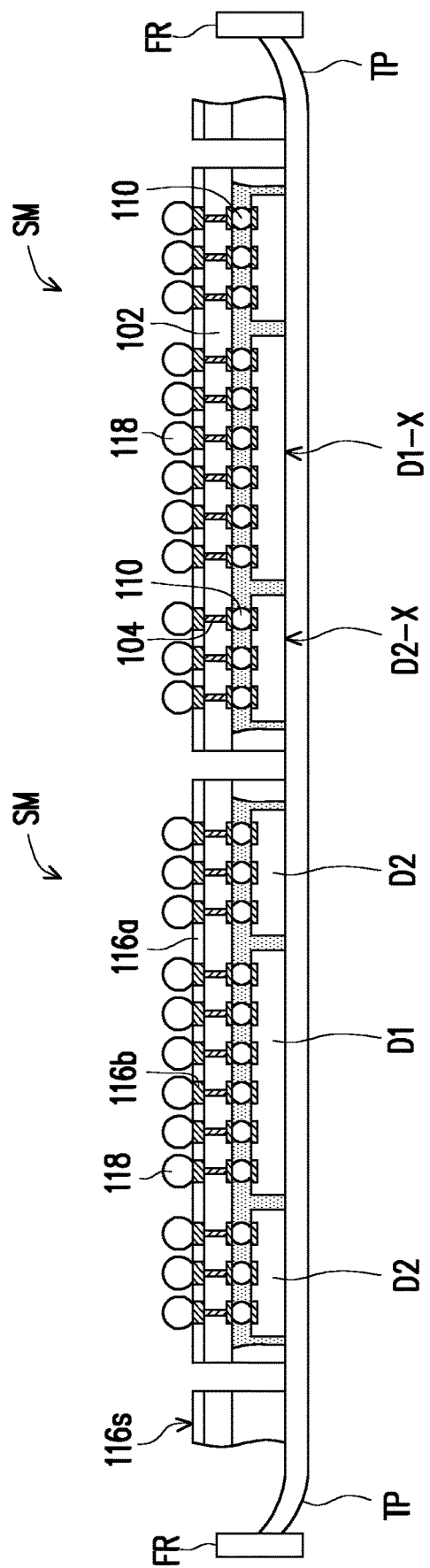

Referring to FIG. 1G, after de-bonding the carrier CR, the structure shown in FIG. 1F is attached to a tape TP (e.g., a dicing tape) supported by a frame FR. Subsequently, the structure shown in FIG. 1F is diced or singulated along the dicing lanes DL to form a plurality of semiconductor packages SM. For example, the dicing process is performed to cut through the redistribution structure 116, the core portion 102, and the insulating encapsulant 114 to remove portions of the redistribution structure 116, the core portion 102, and the insulating encapsulant 114 along the dicing lanes DL. In some embodiments, the dicing process or the singulation process typically involves dicing with a rotating blade or a laser beam. In other words, the dicing or singulation process is, for example, a laser cutting process, a mechanical sawing process, or other suitable processes. After debonding the carrier CR, the singulated semiconductor package SM illustrated in FIG. 1H can be obtained.

Figure 2A:
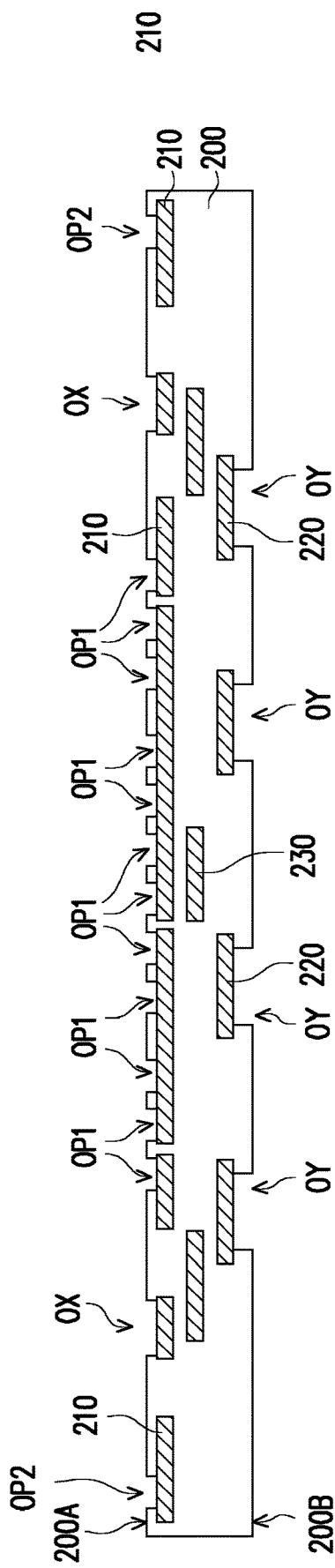
FIG. 2A to FIG. 2F are schematic sectional and top views of various stages in a method of fabricating a package structure according to some exemplary embodiments of the present disclosure.

FIG. 2A to FIG. 2F are schematic sectional and top views of various stages in a method of fabricating a package structure according to some exemplary embodiments of the present disclosure. Referring to FIG. 2A, a circuit substrate 200 is provided. In some embodiments, the circuit substrate 200 is composed of dielectric layers. In certain embodiments, the circuit substrate 200 is an organic flexible substrate or a printed circuit board. In some embodiments, the circuit substrate 200 include conductive pads 210, conductive pads 220, metallization layers 230, and vias (not shown) embedded therein. In some embodiments, the conductive pads 210 and the conductive pads 220 are respectively distributed on two opposite sides of the circuit substrate 200, and are exposed for electrically connecting with later-formed elements/features. For example, in some embodiments the circuit substrate 200 is patterned to form first openings OP1, second openings OP2 and contact openings OX that reveal the conductive pads 210 located on a first side 200A of the circuit substrate 200. Furthermore, in certain embodiments, the circuit substrate 200 is patterned to form openings OY that reveal the conductive pads 220 located on a second side 200B of the circuit substrate 200.

In some embodiments, the metallization layers 230 and the vias are embedded in the circuit substrate 200 and together provide routing function for the circuit substrate 200, wherein the metallization layers 230 and the vias are electrically connected to the conductive pads 210 and the conductive pads 220. In other words, at least some of the conductive pads 210 are electrically connected to some of the conductive pads 220 through the metallization layers 230 and the vias. In some embodiments, the conductive pads 210 and the conductive pads 220 may include metal pads or metal alloy pads. In some embodiments, the materials of the metallization layers 230 and the vias may be substantially the same or similar to the material of the conductive pads 210 and the conductive pads 220.

Figure 2B:
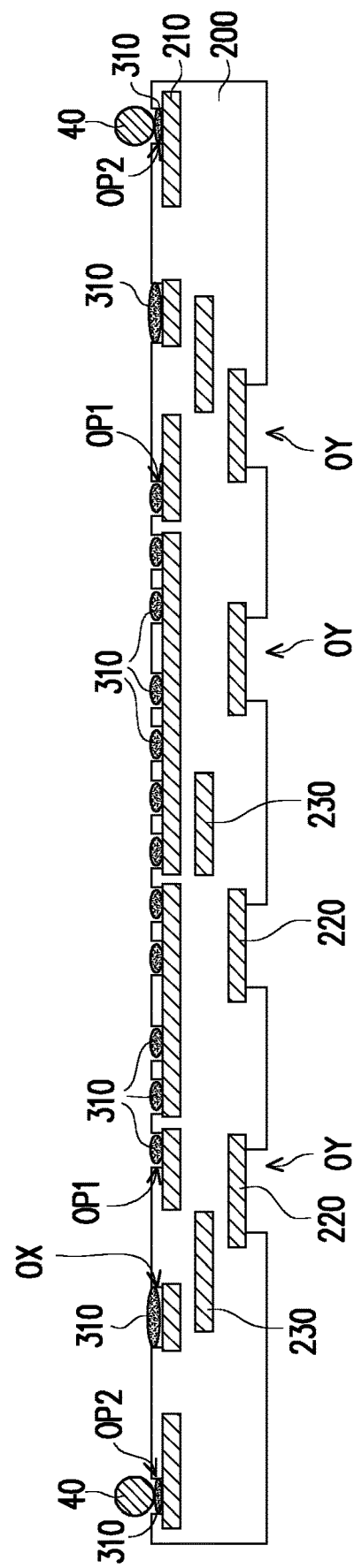

Referring to FIG. 2B, after patterning the circuit substrate 200, solder pastes 310 are disposed within the first openings OP1, the second openings OP2 and the contact openings OX of the circuit substrate 200. For example, solder pastes 310 are disposed within the first openings OP1, the second openings OP2 and the contact openings OX through printing. In a next step, a plurality of first spacer structures 40 are placed within the second openings OP2 of the circuit substrate 200 over the solder pastes 310. In the exemplary embodiment, a material of the first spacer structure 40 is not particularly limited, and can be a conductive material, a polymeric material, or the like. This will be described in detail in later embodiments.

Figure 1H:
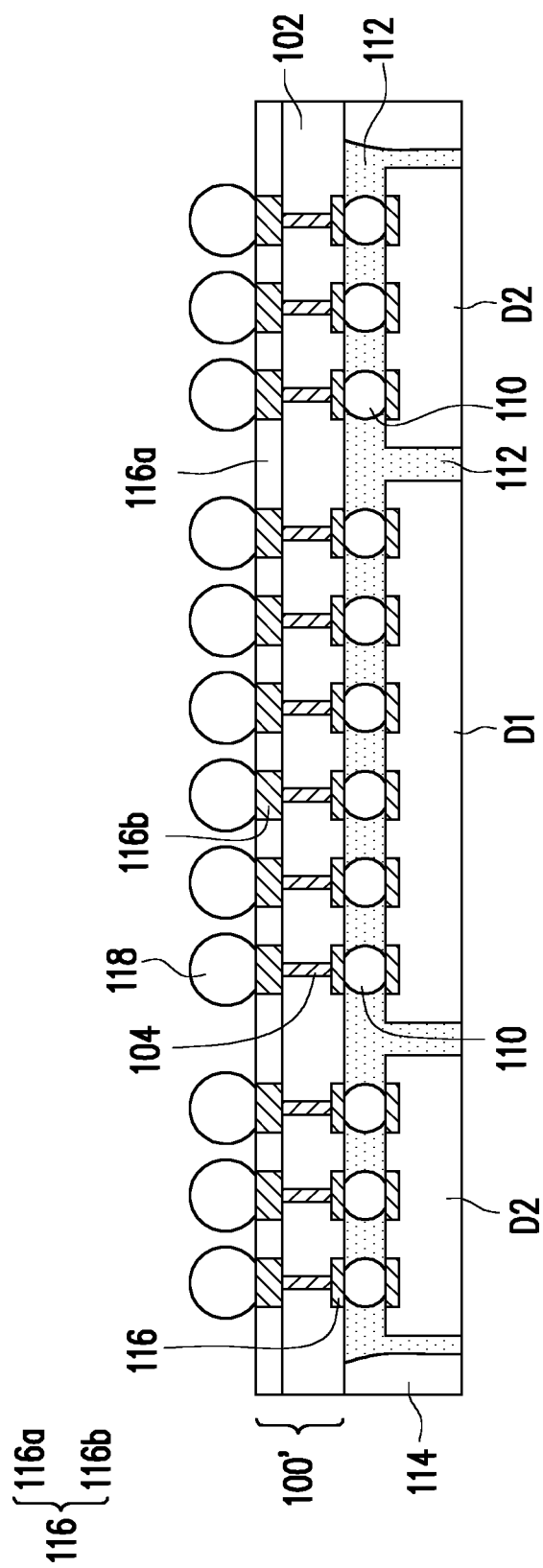
Figure 2C:
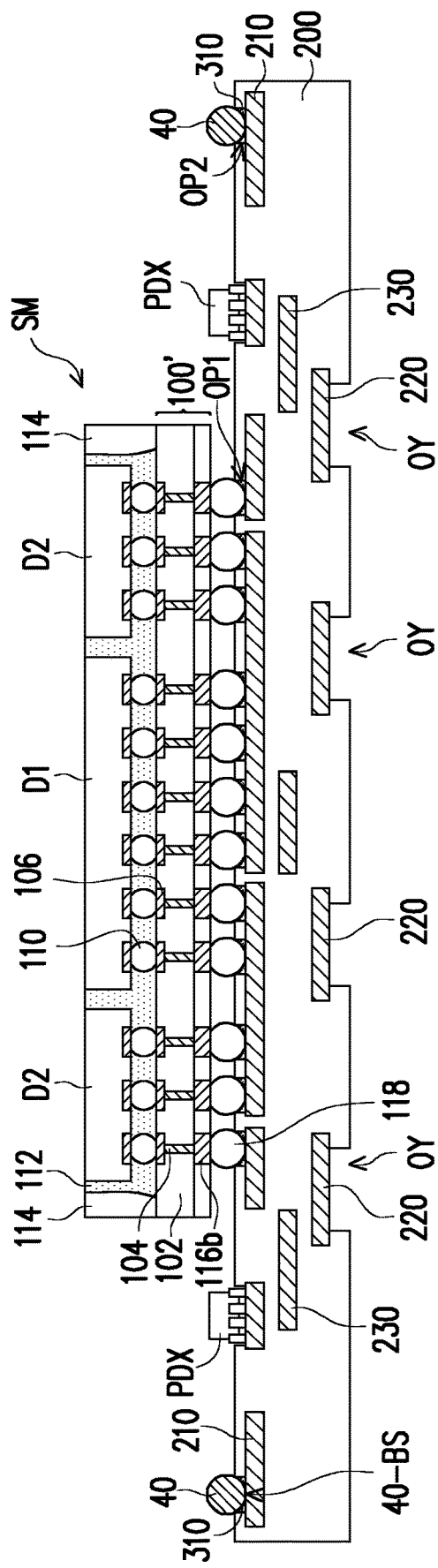
Figure 2D:
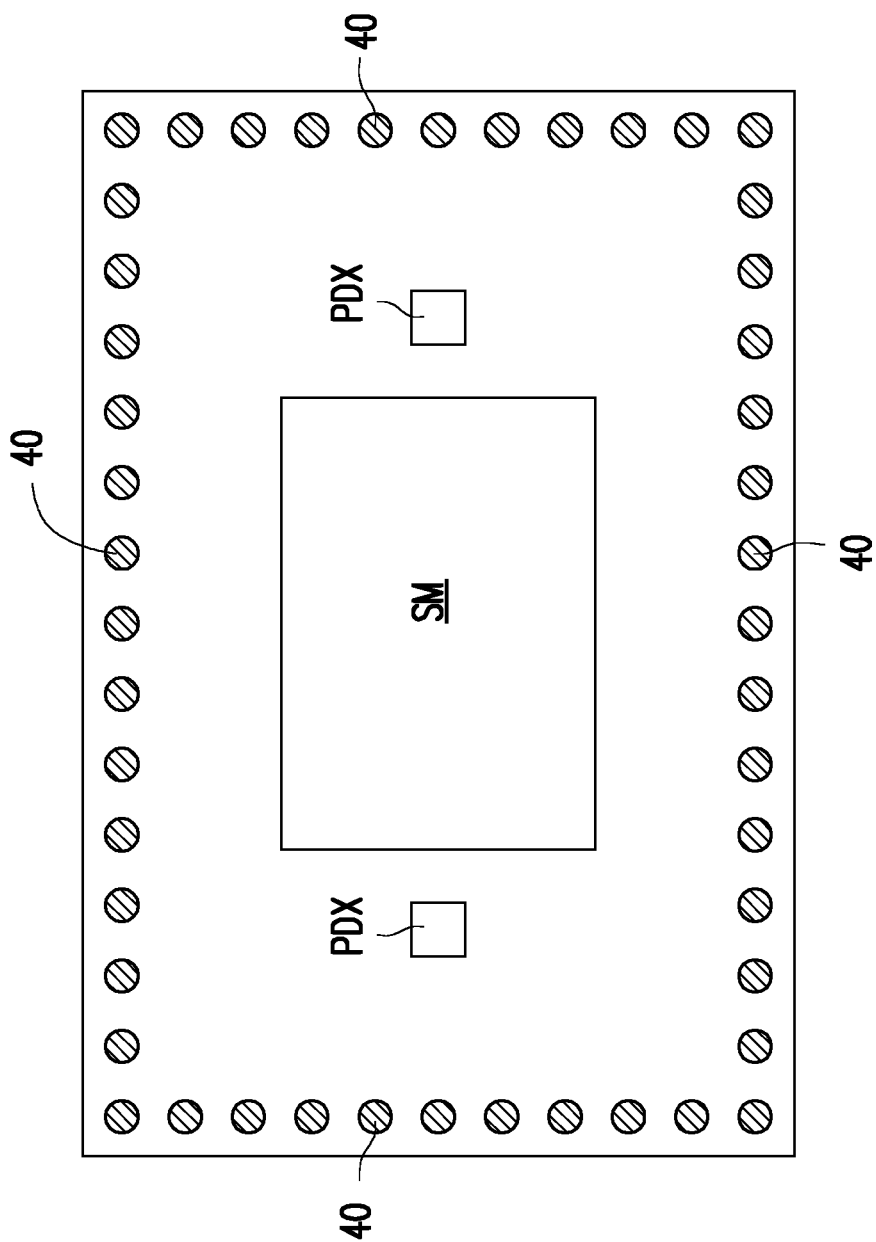

Referring to FIG. 2C, in a subsequent step, the semiconductor package SM obtained in FIG. 1H is mounted onto the circuit substrate 200 through the conductive terminals 118. For example, the semiconductor package SM is mounted on the circuit substrate 200 by disposing the conductive terminals 118 within the first openings OP1 of the circuit substrate 200 over the solder pastes 310. Referring to FIG. 2D, which is a top view of the structure illustrated in FIG. 2C, the semiconductor package SM is disposed on the circuit substrate 200 within an area surrounded by the first spacer structures 40. In certain embodiments, the first spacer structures 40 surround four sides of the semiconductor package SM. Furthermore, approximately 10 to 15 first spacer structures 40 may be located on each side. However, the disclosure is not limited thereto, and the number of first spacer structures 40 surrounding the semiconductor package SM may be adjusted based on product requirement.

As illustrated in FIG. 2C and FIG. 2D, in some embodiments, passive devices PDX (integrated passive device or surface mount devices) may be mounted on the circuit substrate 200 aside the semiconductor package SM. For example, passive devices PDX are mounted on the circuit substrate 200 within the contact openings OX of the circuit substrate 200 over the solder pastes 310. After placing/mounting the first spacer structure 40, the conductive terminals 118 and the passive devices PDX in their respective openings, a reflow process is performed to join the first spacer structures 40 with the conductive pads 210 of the circuit substrate 200. Similarly, the reflow process is performed to join the conductive terminals 118 and the passive devices PDX with the conductive pads 210 of the circuit substrate 200. In other words, the first spacer structure 40, the conductive terminals 118 and the passive devices PDX are mounted on the conductive pads 210 of the circuit substrate 200 through a soldering process. In some embodiments, after performing the reflow process, the semiconductor package SM and the passive devices PDX may be electrically connected to the conductive pads 210 of the circuit substrate 200. In addition, the semiconductor package SM and the passive devices PDX may be further electrically connected to the conductive pads 220, the metallization layers 230 and the vias. In certain embodiments, the first spacer structure 40 may or may not be electrically connected to the conductive pads 220, which will depend on a material of the first spacer structure 40 used. In some embodiments, the first spacer structure 40 has a bottom portion 40-BS that is in physical contact with the conductive pads 210 of the circuit substrate 200.

Figure 2E:
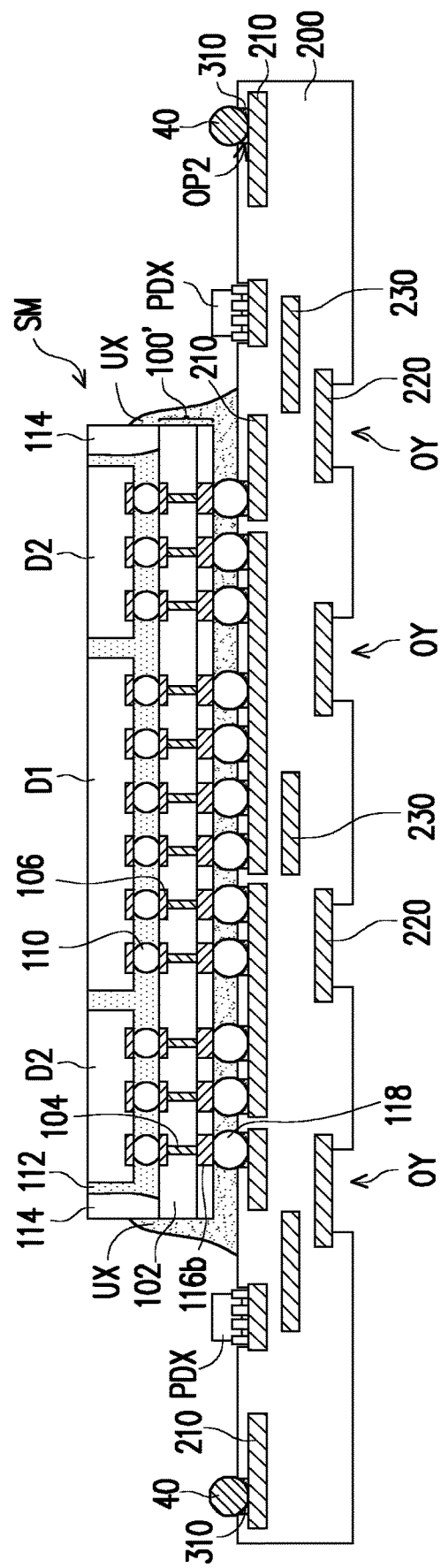

As illustrated in FIG. 2E, in some embodiments, an underfill structure UX is formed to fill up the spaces in between the circuit substrate 200 and the semiconductor package SM. In certain embodiments, the underfill structure UX fills up the spaces in between adjacent conductive terminals 118 and covers the conductive terminals 118. For example, the underfill structure UX surrounds the plurality of conductive terminals 118. In some embodiments, the passive devices PDX are exposed by the underfill structure UX, and kept a distance apart from the underfill structure UX. In other words, the underfill structure UX does not cover the passive devices PDX. In certain embodiments, the underfill structure UX may further cover sidewalls of the semiconductor package SM.

Figure 2F:
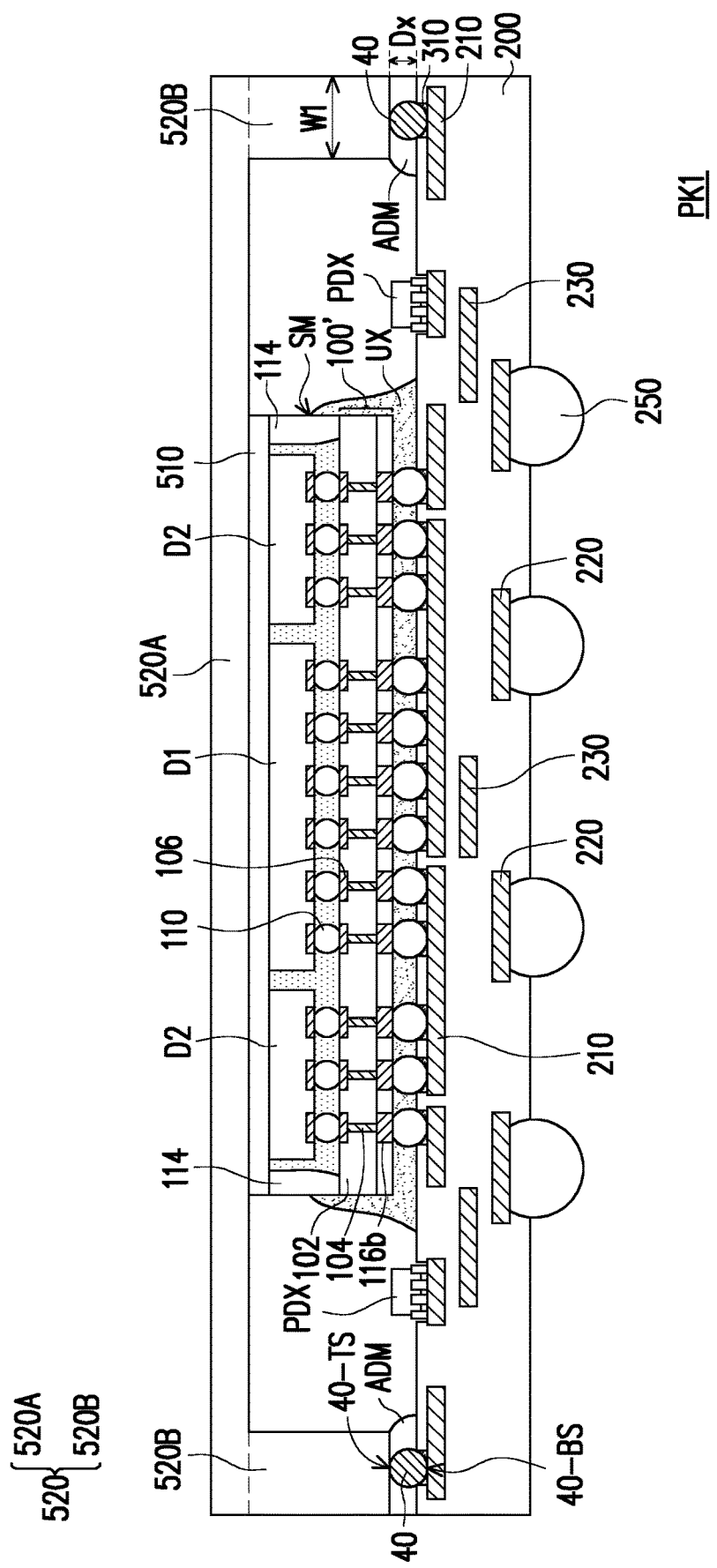

Referring to FIG. 2F, after forming the underfill structure UX, a thermal interface material 510 is disposed on a backside of the semiconductor package SM. Thereafter, a lid structure 520 is attached onto the circuit substrate 200 through an adhesive material ADM. In some embodiments, the lid structure 520 is pressed onto the thermal interface material 510 so that the thermal interface material 510 is sandwiched between the semiconductor package structure SM and the lid structure 520. In some embodiments, the lid structure 520 surrounds the semiconductor package SM and the passive devices PDX. For example, the lid structure 520 includes a cover portion 520A that is located over the semiconductor dies D1 and D2, and includes sidewall portions 520B joined with the cover portion 520A. The sidewall portions 520 may be surrounding the semiconductor dies D1, D2 and the interposer structure 100', and is attached to the circuit substrate 200 through the adhesive material ADM.

As further illustrated in FIG. 2F, the first spacer structures 40 are sandwiched between the lid structure 520 and the circuit substrate 200. For example, the first spacer structures 40 includes a top portion 40-TS in contact with the lid structure 520 and a bottom portion 40-BS in contact with the circuit substrate 200. In some embodiments, the first spacer structures 40 are disposed in between the circuit substrate 200 and the sidewall portions 520B of the lid structure 520, and is adjacent to the adhesive material ADM. In certain embodiments, the adhesive material ADM is also located between the lid structure 520 and the circuit substrate 200 and is surrounding and contacting the first spacer structures 40. Furthermore, in some embodiments, a ratio (W1:Dx) of a width W1 of the sidewall portions 520B to a distance Dx in between the circuit substrate 200 and the sidewall portions 520B is in a range of 10:1 to 30:1. For example, in one exemplary embodiment, when the width W1 is controlled in a range of 2 mm to 3 mm, the distance Dx may be controlled in a range of 100 μm to 200 μm. The distance Dx and the width W1 may be appropriately controlled so that a problem of delamination and non-uniform arrangements of the thermal interface material 510 and the adhesive material ADM, as well as squeeze out and bleeding of these materials can be prevented.

In the exemplary embodiment, by arranging the first spacer structures 40 in between the lid structure 520 and the circuit substrate 200, the distance Dx in between the circuit substrate 200 and the sidewall portions 520B may be appropriately maintained. In other words, the applied force during the attachment of the lid structure 520 onto the circuit substrate 200 is controlled by keeping the distance Dx therebetween. For example, the first spacer structures 40 act to prevent the distance Dx from being too small (excessive applied force) and to prevent the distance Dx from being too large (low applied force). Furthermore, the width W1 of the sidewall portions 520B is directly correlated to the amount of adhesive material ADM used. Thus, the width W1 is also controlled in a certain range so that the sidewall portions 520B of the lid structure 520 are wide enough to cover the first spacer structures 40, while excessive amount of applied adhesive material ADM is prevented.

In certain embodiments, when the ratio (W1:Dx) of the width W1 to the distance Dx is kept in the above range, problems caused by a low applied force (thick thermal interface material 510 causing high thermal resistance) or excessive applied force (squeeze out and bleeding of adhesive material ADM) during the attachment of the lid structure 520, and other related problems such as delamination and non-uniform arrangements of the thermal interface material 510 and adhesives may be prevented. On the other hand, when the ratio (W1:Dx) of the width W1 to the distance Dx is outside of the above range, there is a risk that the thermal interface material 510 and the adhesive material ADM have non-uniform arrangements, causing bleeding and squeeze out etc.

In some embodiments, after attaching the lid structure 520 on the circuit substrate 200, a plurality of conductive balls 250 are placed in the openings OY of the circuit substrate 200 and being electrically connected to the conductive pads 220. In some embodiments, the conductive balls 250 are, for example, solder balls or BGA balls. Up to here, a package structure PK1 according to some exemplary embodiments of the present disclosure is accomplished.

Figure 3A:
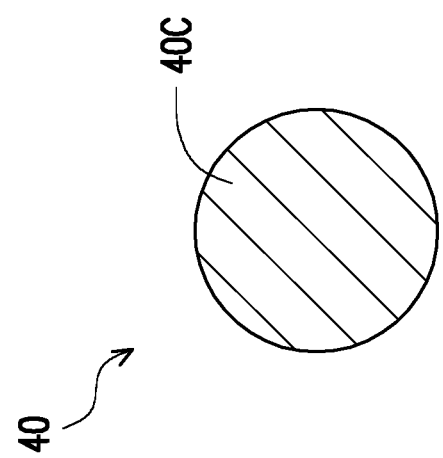
FIG. 3A to FIG. 3C are various designs of a spacer structure according to some exemplary embodiments of the present disclosure.
Figure 3B:
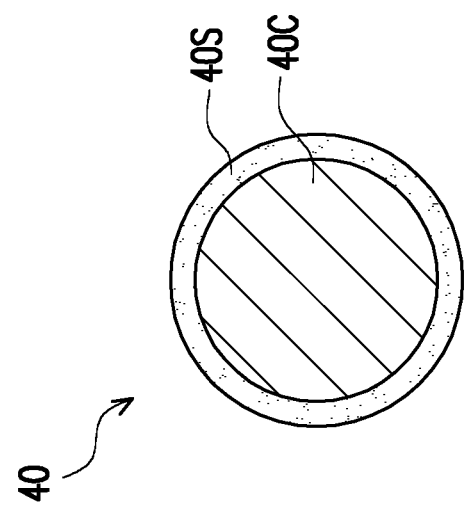
Figure 3C:
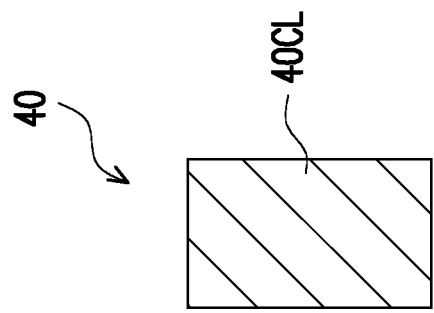

FIG. 3A to FIG. 3C are various designs of a spacer structure according to some exemplary embodiments of the present disclosure. In the above-mentioned embodiments, the first spacer structure 40 is shown to have a ball structure or a spherical structure. However, the disclosure is not limited thereto, and the design of the first spacer structure 40 may be appropriately adjusted. As illustrated in FIG. 3A, the first spacer structure 40 is shown to include a ball structure having a conductive core 40C. In some embodiments, the conductive core 40C may be made of any conductive materials or metallic materials such as copper, tungsten, aluminum, silver, gold or the like, and the disclosure is not limited thereto. As illustrated in FIG. 3B, besides having a conductive core 40C, the first spacer structure 40 may further include a conductive shell 40S coated around the conductive core 40C. In other words, the first spacer structure 40 may include a core-shell structure. In some embodiments, a material of the conductive shell 40S may be any conductive materials, metallic materials or metal alloys. In one exemplary embodiment the conductive shell 40S may be a solder shell. As further illustrated in FIG. 3C, in some embodiments, the first spacer structure 40 includes a pillar structure or a columnar structure 40CL. For example, the pillar structure or columnar structure 40CL may be made of any conductive materials or metallic materials such as copper, tungsten, aluminum, silver, gold or the like, and the disclosure is not limited thereto.

Figure 4B:
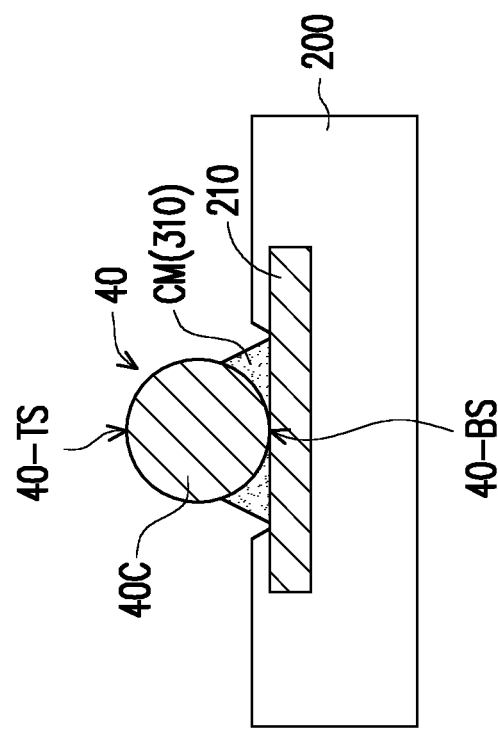
FIG. 4A and FIG. 4B are schematic sectional views of various methods of placing the spacer structure on a circuit substrate according to some exemplary embodiments of the present disclosure.
Figure 4A:
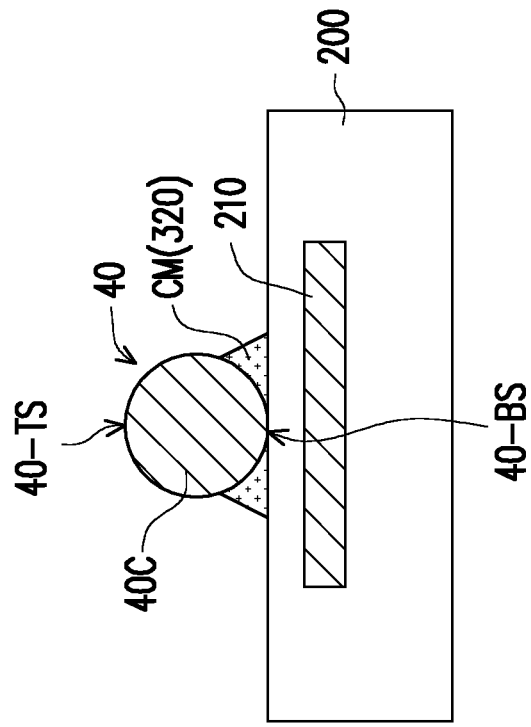

FIG. 4A and FIG. 4B are schematic sectional views of various methods of placing the spacer structure on a circuit substrate according to some exemplary embodiments of the present disclosure. Referring to FIG. 4A, in some embodiments, when the first spacer structure 40 includes a conductive material such as a conductive core 40C, then the first spacer structure 40 may be placed on or attached to the conductive pads 210 of the circuit substrate 200 through a connecting material CM. For example, the connecting material CM may be the solder pastes 310 used in previous embodiments. In some embodiments, the bottom portion 40-BS of the conductive core 40C is in contact with the conductive pads 210, while the connecting material CM surrounds the conductive core 40C and contacts the conductive pads 210.

In one exemplary embodiment when a conductive material such as a conductive core 40C or a conductive shell 40S is located on an outer surface of the first spacer structure 40, then the first spacer structure 40 may be joined with the circuit substrate 200 through a reflow process. For example, in such embodiments, first openings OP1 and second openings OP2 are formed on the circuit substrate 200, and solder pastes 310 are disposed within the first openings OP1 and the second openings OP2 of the circuit substrate 200. The first spacer structures 40 may be placed within the second openings OP2 of the circuit substrate 200, while the conductive terminals 118 of the semiconductor package SM are disposed within the first openings OP1 of the circuit substrate 200. Thereafter, a reflow process may be performed to join both the first spacer structures 40 and the conductive terminals 118 with the conductive pads 210 of the circuit substrate 200.

Referring to FIG. 4B, in some other embodiments, when the first spacer structure 40 includes a conductive material such as a conductive core 40C, then the first spacer structure 40 may be placed on or attached to the dielectric layers of the circuit substrate 200 through another connecting material CM. For example, the connecting material CM may be any adhesives 320, a glue or the like. In some embodiments, the bottom portion 40-BS of the conductive core 40C is in contact with the dielectric layers of the circuit substrate 200, while the connecting material CM surrounds the conductive core 40C and contacts the circuit substrate 200.

Figure 5B:
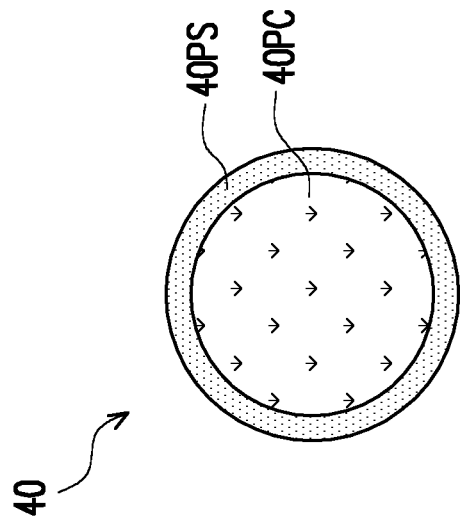
FIG. 5A and FIG. 5B are various designs of a spacer structure according to some other exemplary embodiments of the present disclosure.
Figure 5A:
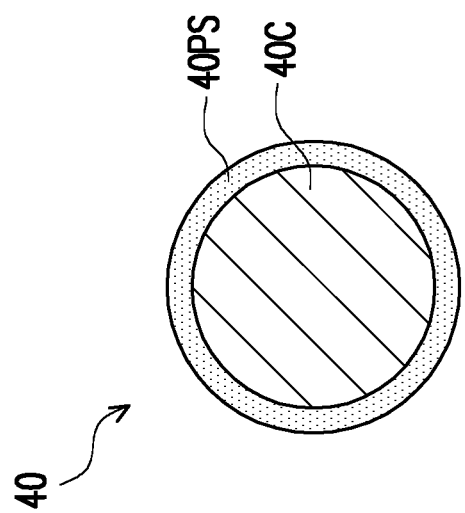

FIG. 5A and FIG. 5B are various designs of a spacer structure according to some other exemplary embodiments of the present disclosure. In the previous embodiments, the first spacer structure 40 is attached to the circuit substrate 200 through conductive materials, but the disclosure is not limited thereto, and other materials may be applied. Referring to FIG. 5A, in some embodiments, the first spacer structure 40 is shown to include a ball structure having a conductive core 40C, while the conductive core 40C is coated with a polymeric shell 40PS. In other words, a core-shell structure having a non-conductive shell located on the outer surface of the conductive core 40C is applied for the first spacer structure 40. Referring to FIG. 5B, in some other embodiments, the first spacer structure 40 is shown to include a ball structure having a polymeric core 40PC, while the polymeric core 40PC is coated with a polymeric shell 40PS. In other words, a core-shell structure having a non-conductive shell located on the outer surface of the polymeric shell 40PS is applied for the first spacer structure 40. In some alternative embodiments, the first spacer structure 40 may include a polymeric core 40PC without any shell structure coated thereon.

Figure 6A:
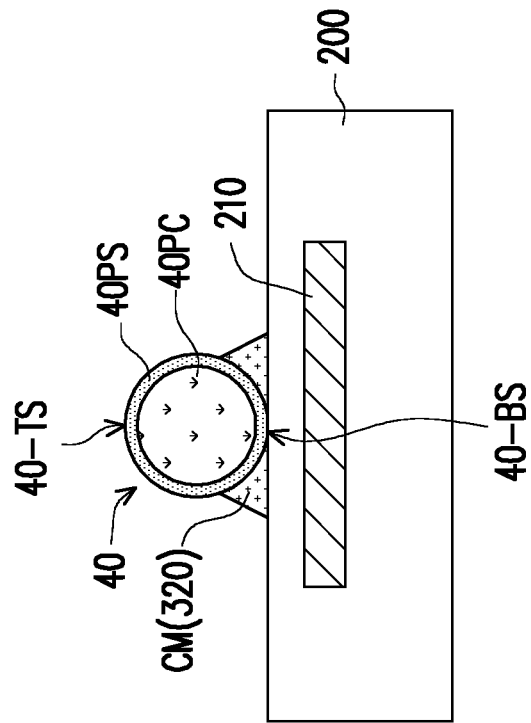
FIG. 6A and FIG. 6B are schematic sectional views of various methods of placing the spacer structure on a circuit substrate according to some exemplary embodiments of the present disclosure.
Figure 6B:
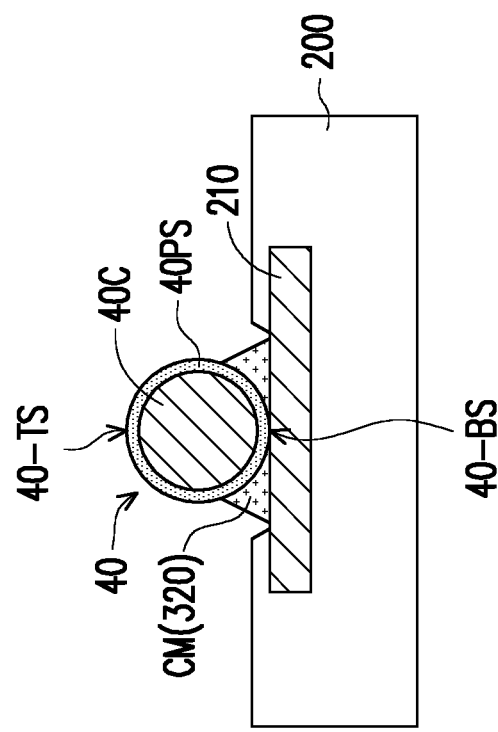

FIG. 6A and FIG. 6B are schematic sectional views of various methods of placing the spacer structure on a circuit substrate according to some exemplary embodiments of the present disclosure. Referring to FIG. 6A, in some embodiments, when the first spacer structure 40 includes a non-conductive material such as a polymeric shell 40PS covering the conductive core 40C, then the first spacer structure 40 may be placed on or attached to the conductive pads 210 of the circuit substrate 200 through a connecting material CM. For example, the connecting material CM may be any adhesives 320, a glue or the like. In a similar way, the bottom portion 40-BS of the polymeric shell 40PS is in contact with the conductive pads 210, while the connecting material CM surrounds the polymeric shell 40PS and contacts the conductive pads 210.

In one exemplary embodiment when a polymeric material such as a polymeric core 40PC or a polymeric shell 40PS is located on an outer surface of the first spacer structure 40, then the first spacer structure 40 maybe joined with the circuit substrate 200 through an adhesive 320. For example, in such embodiments, first openings OP1 and second openings OP2 are formed on the circuit substrate 200, and the first spacer structures 40 are placed in the second openings OP2 and joined with the conductive pads 210 of the circuit substrate 200 through the adhesive 320. In some embodiments, solder pastes 310 are disposed within the first openings OP1, and the conductive terminals 118 of the semiconductor package SM are disposed within the first openings OP1 of the circuit substrate 200. Thereafter, a reflow process may be performed to join the conductive terminals 118 with the conductive pads 210 of the circuit substrate 200.

Referring to FIG. 6B, in some other embodiments, when the first spacer structure 40 includes a non-conductive material such as a polymeric shell 40PS covering the polymeric core 40PC, then the first spacer structure 40 may be placed on or attached to the dielectric layers of the circuit substrate 200 through the connecting material CM. For example, the connecting material CM may be any adhesives 320, a glue or the like. In some embodiments, the bottom portion 40-BS of the polymeric core 40PC is in contact with the dielectric layers of the circuit substrate 200, while the connecting material CM surrounds the polymeric core 40PC and contacts the circuit substrate 200.

FIG. 7A to FIG. 7D are schematic sectional and top views of various stages in a method of fabricating a package structure according to some exemplary embodiments of the present disclosure. The method illustrated in FIG. 7A to FIG. 7D is similar to the method illustrated in FIG. 2A to FIG. 2F, hence the same reference numerals are used to refer to the same or liked parts, and its detailed description will be omitted herein. The difference between the embodiments is that second spacer structure 42 are further provided.

Figure 7A:
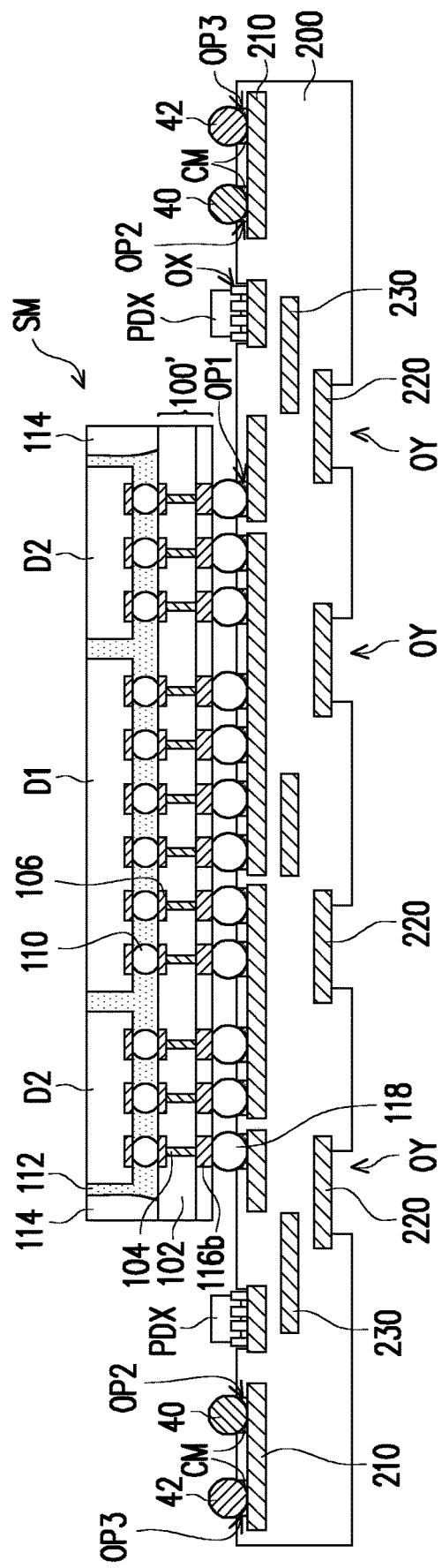
FIG. 7A to FIG. 7D are schematic sectional and top views of various stages in a method of fabricating a package structure according to some exemplary embodiments of the present disclosure.

Referring to FIG. 7A, the same methods described in FIG. 2A to FIG. 2C may be performed to dispose the conductive terminals 118 of the semiconductor package SM in the first openings OP1, to dispose the first spacer structures 40 in the second openings OP2, and to dispose the passive devices PDX in the contact openings OX. As illustrated in FIG. 7A, in some embodiments, a plurality of third openings OP3 are further formed in the circuit substrate 200, and a plurality of second spacer structures 42 is disposed within the third openings OP3. In some embodiments, the first spacer structures 40 and the second spacer structures 42 are attached to the conductive pads 210 of the circuit substrate 200 by using the connecting material CM as mentioned previously. In the exemplary embodiment, a material and design of the second spacer structures 42 may be the same as the first spacer structures 40. In some alternative embodiments, a material and design of the second spacer structures 42 may be different than the first spacer structures 40. For example, the various designs of spacer structures shown in FIG. 3A to FIG. 3C, FIG. 5A and FIG. 5B may be applied to the second spacer structures 42.

Figure 7B:
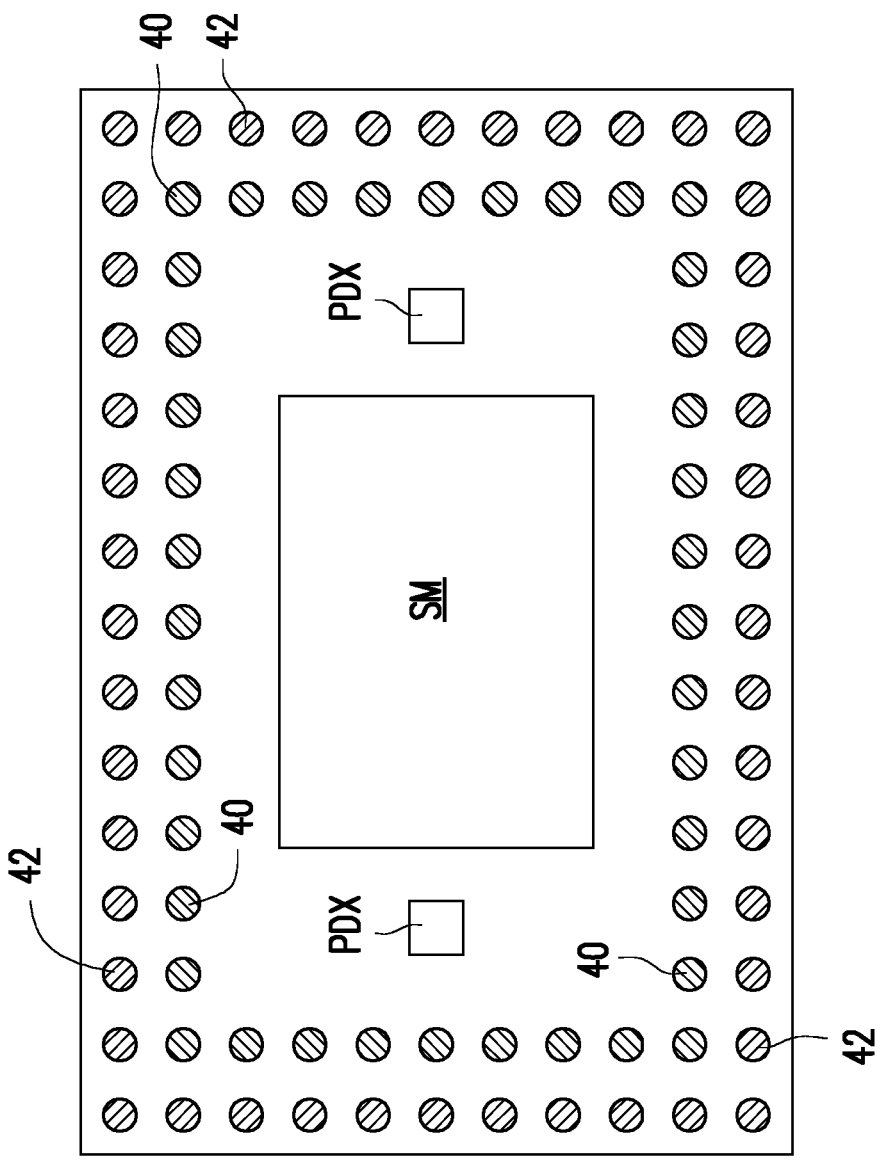
Figure 7C:
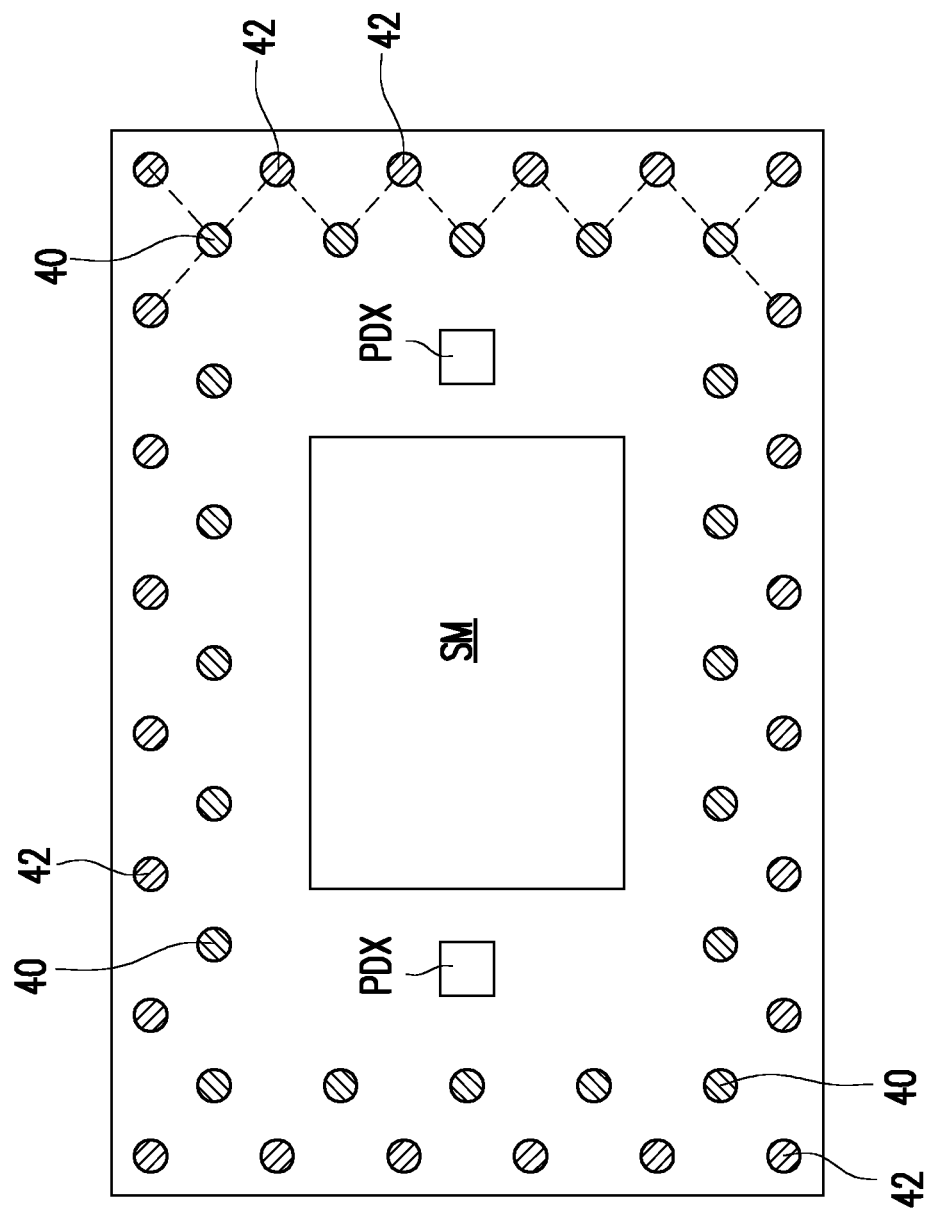

As illustrated in FIG. 7B, which is a top view of the structure shown in FIG. 7A, in some embodiments, the second spacer structures 42 may be disposed on the circuit substrate 200 to surround the first spacer structures 40. For example, the second spacer structures 42 may be arranged aside the first spacer structures 40 in a parallel fashion surrounding four sides of the semiconductor package SM. However, the disclosure is not limited thereto, and the arrangements of the second spacer structures 42 may be adjusted based on design requirement. For instance, in some alternative embodiments as shown in FIG. 7C, the first spacer structures 40 and the second spacer structures 42 are arranged in a zig-zag manner or staggered arrangement on the circuit substrate 200 surrounding the semiconductor package SM. For example, the first spacer structures 40 and the second spacer structures 42 may be surrounding the interposer structure 100'.

Figure 7D:
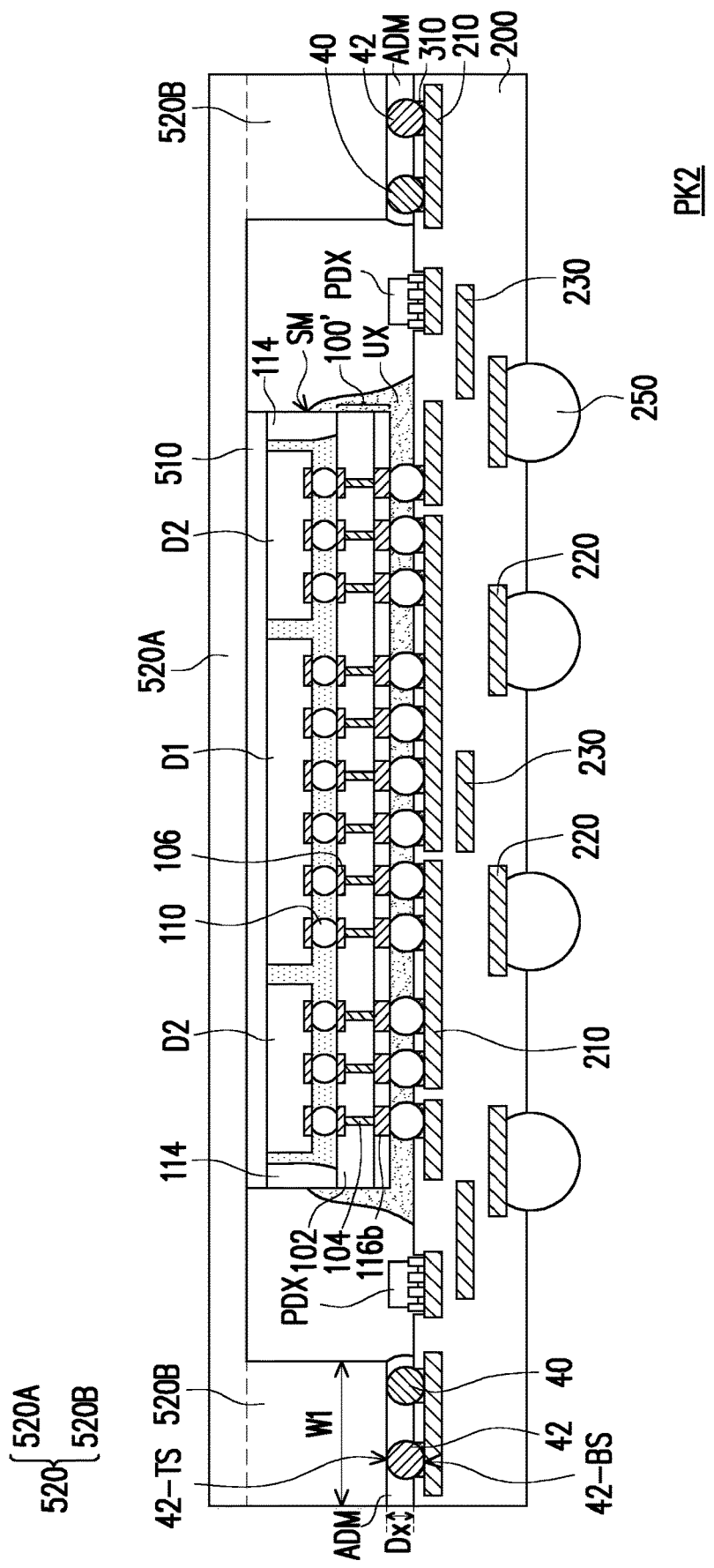

Referring to FIG. 7D, after disposing the first spacer structures 40 and the second spacer structures 42 on the circuit substrate 200, a lid structure 520 is attached onto the circuit substrate 200 through an adhesive material ADM. In the exemplary embodiment, the second spacer structures 42 are sandwiched between the lid structure 520 and the circuit substrate 200, and includes a top portion 42-TS in contact with the lid structure 520 and a bottom portion 42-BS in contact with the circuit substrate 200. For example, the second spacer structures 42 are disposed in between the circuit substrate 200 and the sidewall portions 520B of the lid structure 520 adjacent to the adhesive material ADM.

As further illustrated in FIG. 7D, the adhesive material ADM is sandwiched in between the lid structure 520 and the circuit substrate 200, and covers and contacts the first spacer structures 40 and the second spacer structures 42. Furthermore, in some embodiments, a ratio (W1:Dx) of a width W1 of the sidewall portions 520B to a distance Dx in between the circuit substrate 200 and the sidewall portions 520B is still kept in a range of 10:1 to 30:1. As such, a problem of delamination and non-uniform arrangements of the thermal interface material 510 and the adhesive material ADM, as well as squeeze out and bleeding of these materials can be prevented.

For example, in the exemplary embodiment, when the ratio (W1:Dx) of the width W1 to the distance Dx is kept in the above range, problems caused by a low applied force (thick thermal interface material 510 causing high thermal resistance) or excessive applied force (squeeze out and bleeding of adhesive material ADM) during the attachment of the lid structure 520, and other related problems such as delamination and non-uniform arrangements of the thermal interface material 510 and adhesives may be prevented. On the other hand, when the ratio (W1:Dx) of the width W1 to the distance Dx is outside of the above range, there is a risk that the thermal interface material 510 and the adhesive material ADM have non-uniform arrangements, causing bleeding and squeeze out etc.

After attaching the lid structure 520 on the circuit substrate 200, a plurality of conductive balls 250 are placed in the openings OY of the circuit substrate 200 and being electrically connected to the conductive pads 220. Up to here, a package structure PK2 according to some exemplary embodiments of the present disclosure is accomplished.

Figure 8B:
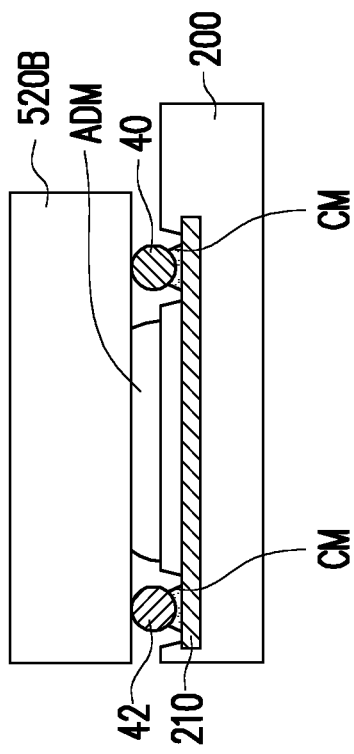
FIG. 8A to FIG. 8C are enlarged sectional views of various package structures according to some exemplary embodiments of the present disclosure.
Figure 8A:
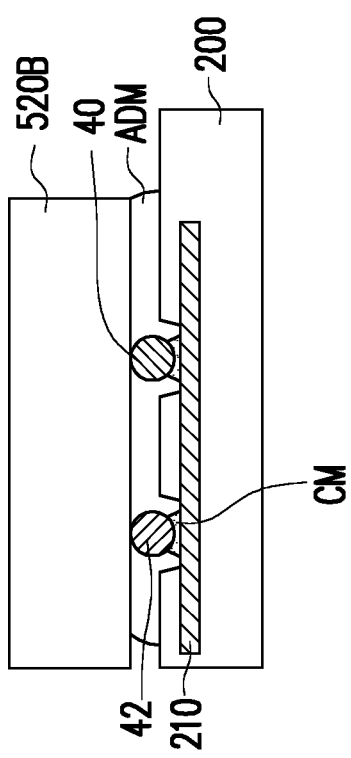
Figure 8C:
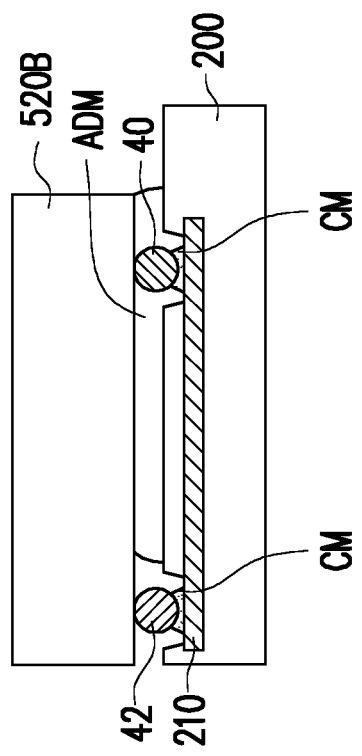

FIG. 8A to FIG. 8C are enlarged sectional views of various package structures according to some exemplary embodiments of the present disclosure. For embodiments including the first spacer structures 40 and the second spacer structures 42, their arrangements with respect to the adhesive material ADM is further described. Referring to FIG. 8A, in some embodiments, the sidewall portion 520B of the lid structure 520 is attached to the circuit substrate 200 through an adhesive material ADM, whereby the adhesive material ADM covers and contacts both the first spacer structures 40 and the second spacer structures 42. However, the disclosure is not limited thereto.

Referring to FIG. 8B, in some embodiments, the sidewall portion 520B of the lid structure 520 is attached to the circuit substrate 200 through the adhesive material ADM, but the adhesive material ADM is spaced apart from the first spacer structures 40 and the second spacer structures 42. In other words, the adhesive material ADM does not contact the first spacer structures 40 and the second spacer structures 42. In such embodiments, the first spacer structures 40 and the second spacer structures 42 are located further away from one another (with respect to the arrangement shown in FIG. 8A). In certain embodiments, the adhesive material ADM is located in the space between the first spacer structures 40 and the second spacer structures 42 and is sandwiched in between the circuit substrate 200 and the sidewall portion 520B of the lid structure 520.

Referring to FIG. 8C, in some embodiments, the sidewall portion 520B of the lid structure 520 is attached to the circuit substrate 200 through the adhesive material ADM, whereby the adhesive material ADM covers and contact the first spacer structures 40 and is spaced apart from the second spacer structures 42. However, the disclosure is not limited thereto. In some alternative embodiments, the adhesive material ADM covers and contact the second spacer structures 42 and is spaced apart from the first spacer structures 40. In other words, the adhesive material ADM may cover at least one of the plurality of first spacer structures 40 and the plurality of second spacer structures 42, while being spaced apart from another one of the plurality of first spacer structures 40 and the plurality of second spacer structures 42. Such embodiment may be achieved by selectively disposing the adhesive material ADM over the first spacer structure 40 or the second spacer structure 42 during the attachment of the lid structure 520 to the circuit substrate 200.

Figure 9:
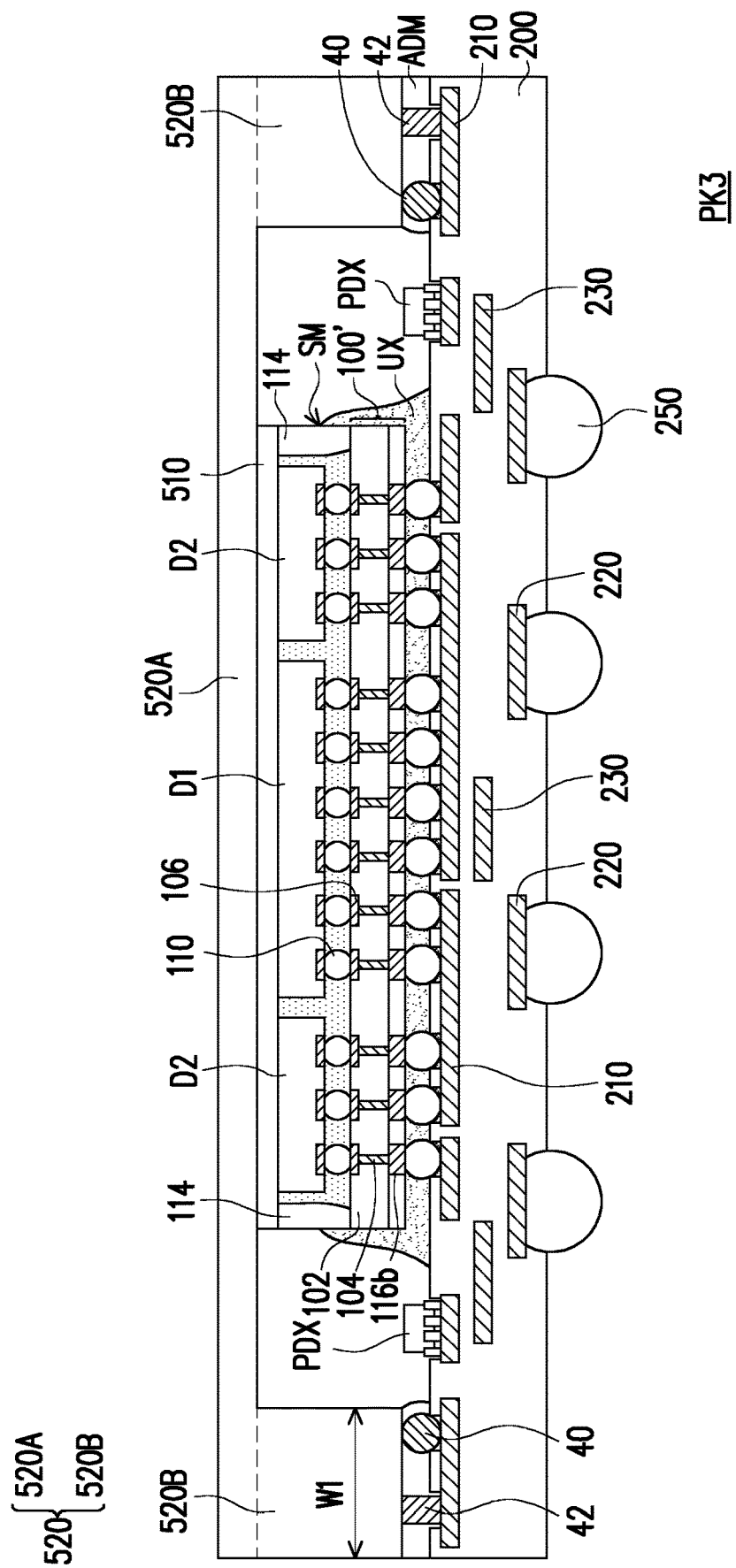
FIG. 9 is a package structure according to some other exemplary embodiments of the present disclosure.

FIG. 9 is a package structure according to some other exemplary embodiments of the present disclosure. The package structure PK3 illustrated in FIG. 9 is similar to the package structure PK2 illustrated in FIG. 7D, hence the same reference numerals are used to refer to the same or liked parts, and its detailed description will be omitted herein. The difference between the embodiments is in the design of the second spacer structures 42. In the previous embodiments, the first spacer structures 40 and the second spacer structures 42 both have ball structure designs in the package structure. However, the disclosure is not limited thereto. Referring to FIG. 9, in some embodiments, the first spacer structures 40 have ball structures while the second spacer structures 42 have pillar or columnar structures. In case where the first spacer structures 40 and the second spacer structures 42 have different designs, they may still have substantially the same height. Based on the above embodiment, it can be noted that the design and arrangement of the spacer structures (40/42) may be appropriately adjusted as long as the spacer structures (40/42) assist in controlling a height or distance between the circuit substrate 200 and the lid structure 520.

Figure 10A:
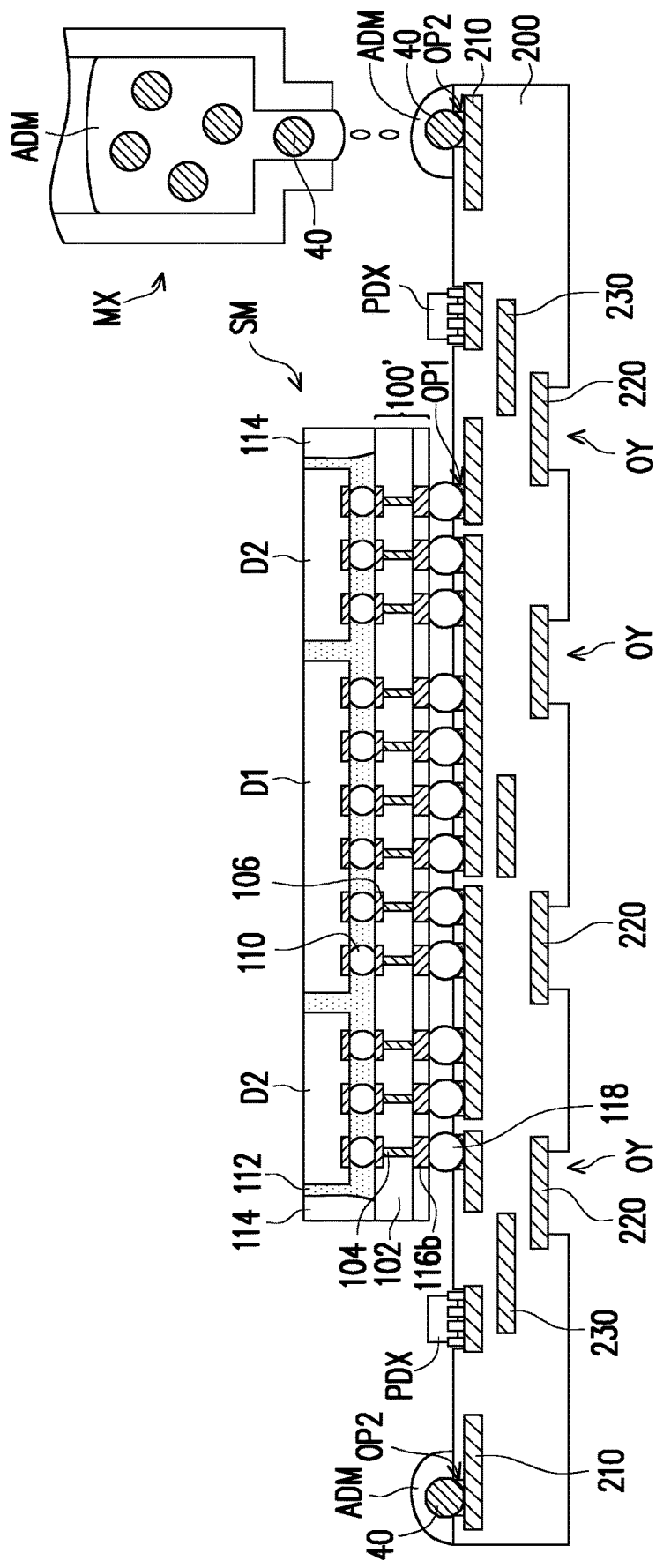
FIG. 10A and FIG. 10B are schematic sectional views of various stages in a method of fabricating a package structure according to some other exemplary embodiments of the present disclosure.
Figure 10B:
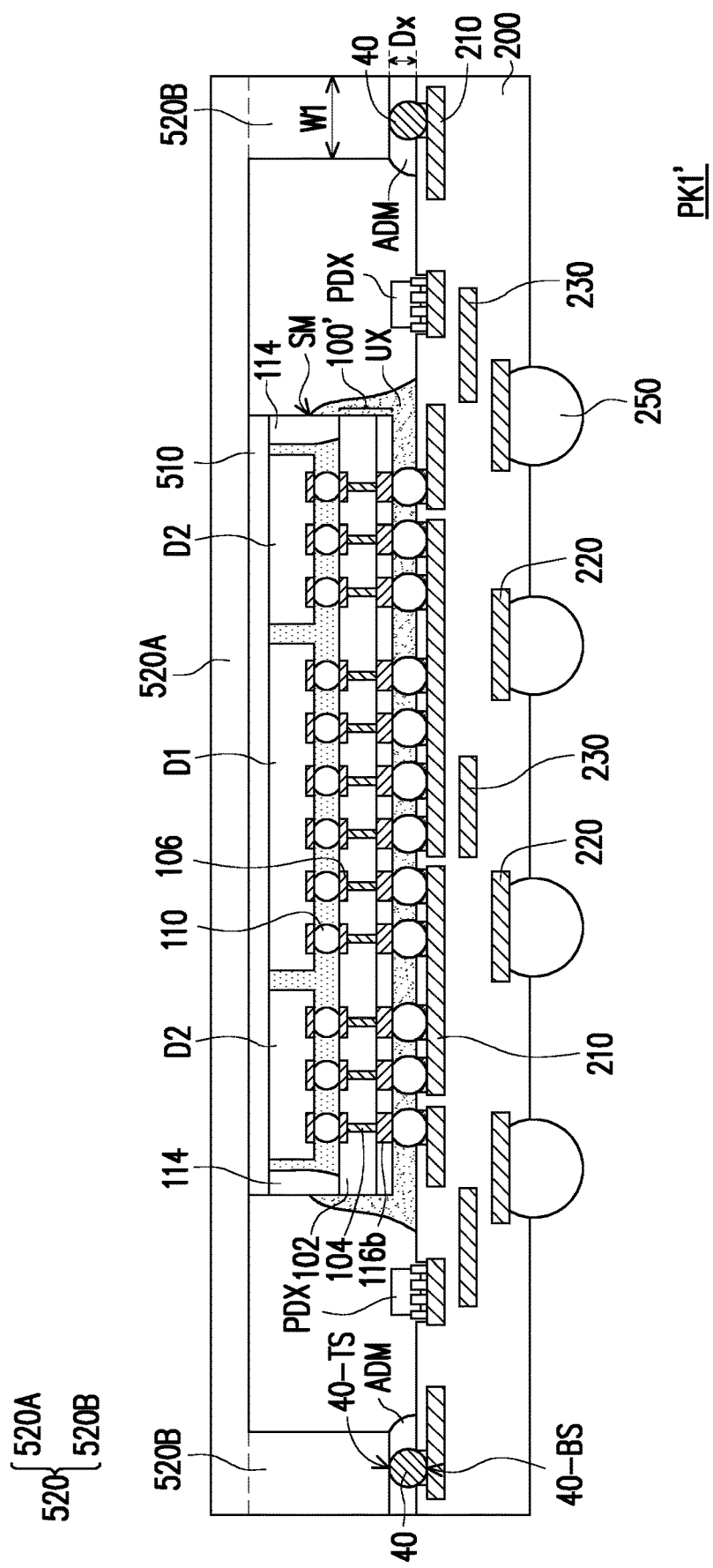

FIG. 10A and FIG. 10B are schematic sectional views of various stages in a method of fabricating a package structure according to some other exemplary embodiments of the present disclosure. The method illustrated in FIG. 10A and FIG. 10B is similar to the method illustrated in FIG. 2A to FIG. 2F, hence the same reference numerals are used to refer to the same or liked parts, and its detailed description will be omitted herein. The difference between the embodiments is in the method of attaching the first spacer structures 40 to the circuit substrate 200.

In the previous embodiments, the first spacer structures 40 may be attached to circuit substrate 200 (either on the dielectric layer or on conductive pads 210) through a connecting material CM (such as solder paste 310 or adhesives 320, and with or without reflow processes). However, the disclosure is not limited thereto, and the connecting material CM may be omitted. For example, referring to FIG. 10A, in some embodiments, a mixture MX is first formed by mixing the first spacer structures 40 with the adhesive material ADM. In certain embodiments, the mixture MX is dispensed onto the circuit substrate 200. For example, the mixture MX may be dispensed on the circuit substrate 200 so that the first spacer structures 40 are located within the second openings OP2 of the circuit substrate 200, while the adhesive material ADM is covering the first spacer structures 40. In some alterative embodiments, the mixture MX may be dispensed on the circuit substrate 200 so that the first spacer structures 40 are disposed on the dielectric layers of the circuit substrate 200.

Referring to FIG. 10B, after dispensing the mixture MX on the circuit substrate 200, the lid structure 520 may be attached to the circuit substrate 200 through the adhesive material ADM, whereby the first spacer structures 40 is sandwiched in between the lid structure 520 and the circuit substrate 200. Up to here, a package structure PK1' according to some other exemplary embodiments of the present disclosure may be accomplished. It should be noted that in other embodiments where second spacer structures 42 exist, the second spacer structures 42 may also be disposed on the circuit substrate 200 through forming a mixture, and the mixture may be dispensed on the circuit substrate 200 for attachment of the lid structure 520.

Figure 11:
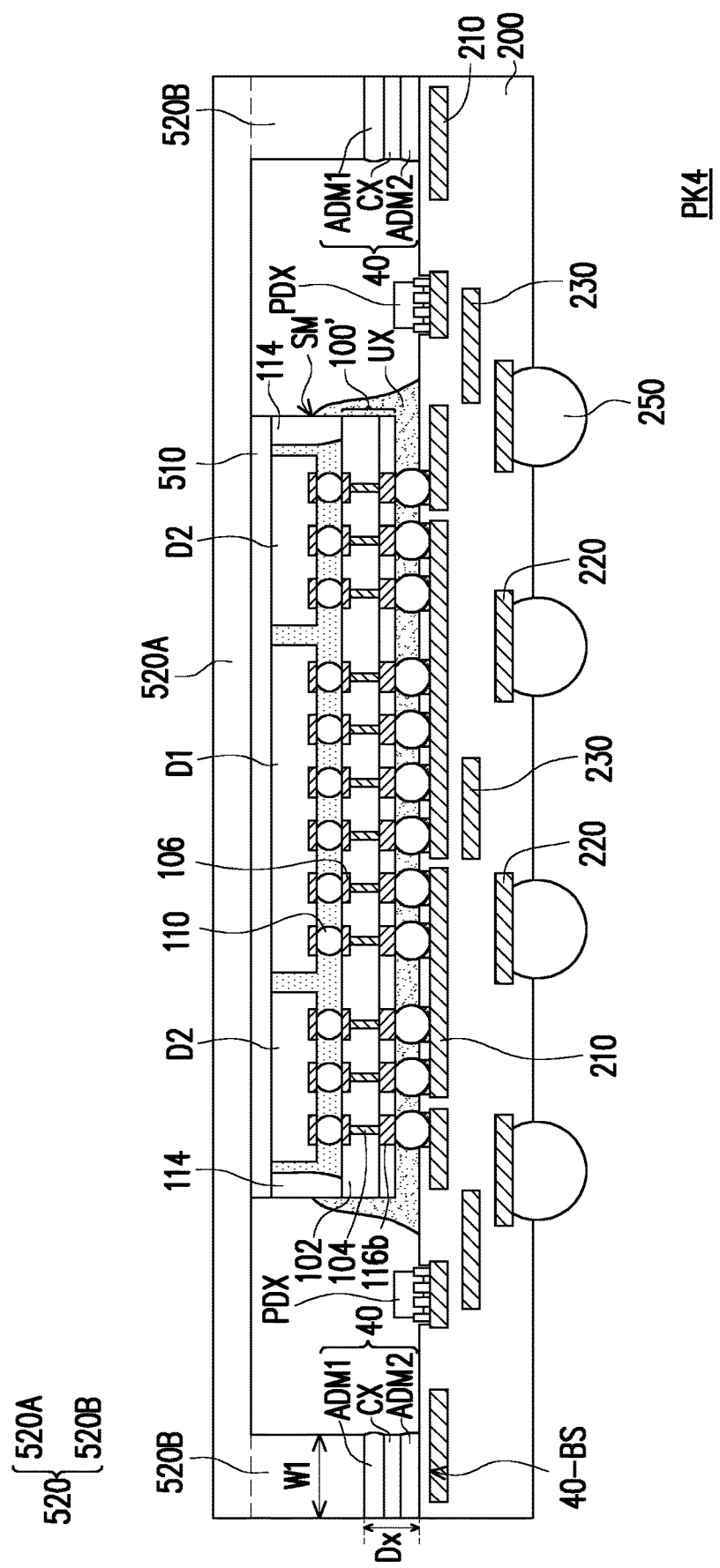
FIG. 11 is a package structure according to some other exemplary embodiments of the present disclosure.

FIG. 11 is a package structure according to some other exemplary embodiments of the present disclosure. The package structure PK4 illustrated in FIG. 11 is similar to the package structure PK1 illustrated in FIG. 2F, hence the same reference numerals are used to refer to the same or liked parts, and its detailed description will be omitted herein. The difference between the embodiments is in between the design and arrangements of the first spacer structures 40 and the adhesive materials ADM.

As illustrated in FIG. 11, in some embodiments, the adhesive materials may be formed as part of the first spacer structures 40. For example, in the exemplary embodiment, the first spacer structure 40 may include a carrier Cx, an adhesive material ADM1 located on one surface of the carrier Cx, and another adhesive material ADM2 located on another surface of the carrier Cx. For example, the first spacer structure 40 may be a double-sided tape spacer. In certain embodiments, the adhesive material ADM1 is attached to the lid structure 520 while the adhesive material ADM2 is attached to the circuit substrate 200. Similar to the above embodiments, the lid structure 520 may be attached to the circuit substrate 200 through an adhesive material (ADM1 and ADM2), while the first spacer structure 40 (including ADM1, Cx and ADM2) is sandwiched in between the lid structure 520 and the circuit substrate 200. Similarly, in the exemplary embodiment, a ratio (W1:Dx) of a width W1 of the sidewall portions 520B to a distance Dx in between the circuit substrate 200 and the sidewall portions 520B is still kept in a range of 10:1 to 30:1. As such, a problem of delamination and non-uniform arrangements of the thermal interface material 510 and the adhesive materials (ADM1/ADM2), as well as squeeze out and bleeding of these materials can be prevented.

For example, in the exemplary embodiment, when the ratio (W1:Dx) of the width W1 to the distance Dx is kept in the above range, problems caused by a low applied force (thick thermal interface material 510 causing high thermal resistance) or excessive applied force (squeeze out and bleeding of thermal interface material 510) during the attachment of the lid structure 520, and other related problems such as delamination and non-uniform arrangements of the thermal interface material 510 and adhesives may be prevented. On the other hand, when the ratio (W1:Dx) of the width W1 to the distance Dx is outside of the above range, there is a risk that the thermal interface material 510 and the adhesive materials have non-uniform arrangements, causing bleeding and squeeze out etc.

Up to here, a package structure PK4 according to some exemplary embodiments of the present disclosure is accomplished.

Figure 12:
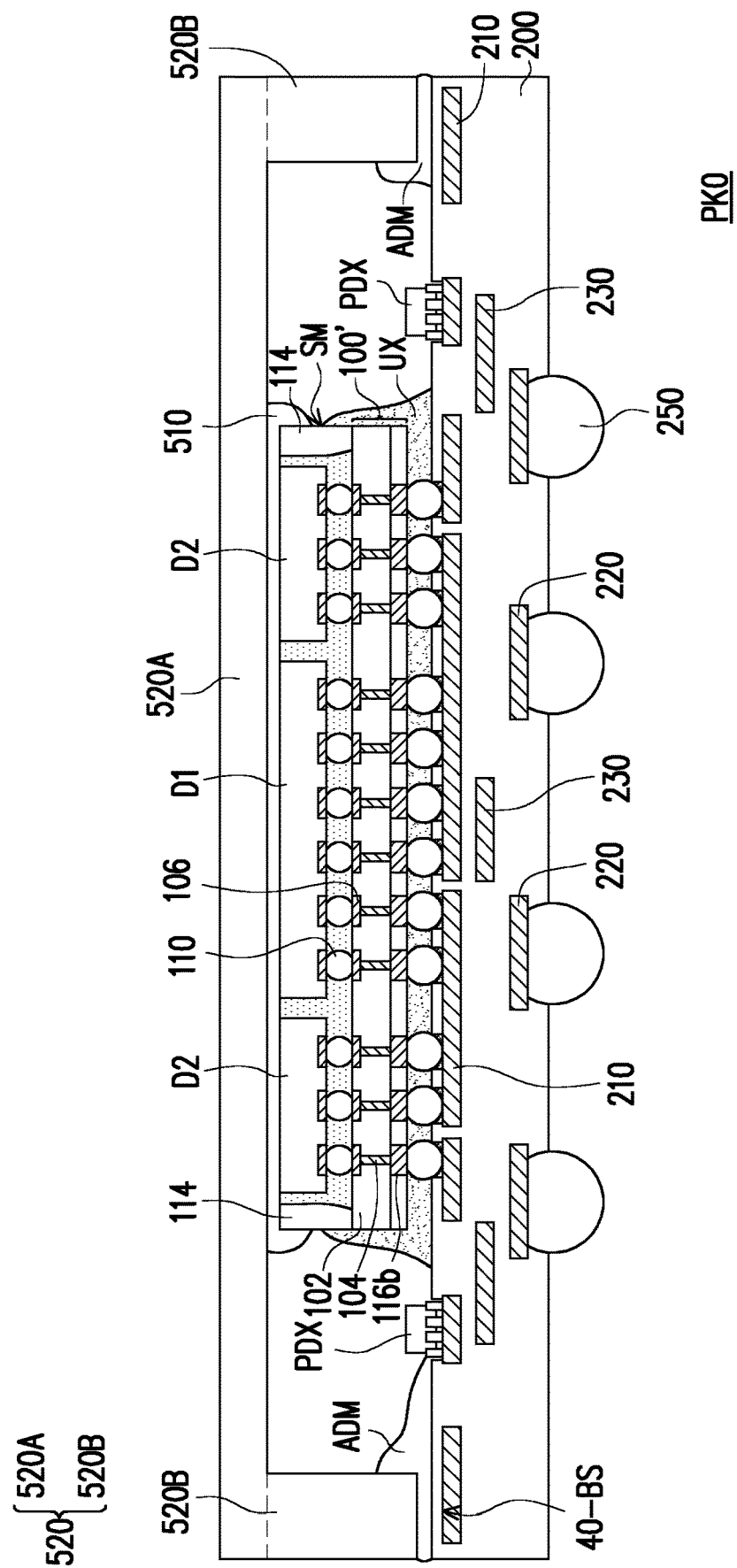
FIG. 12 is a package structure according to some comparative embodiments of the present disclosure.

FIG. 12 is a package structure according to some comparative embodiments of the present disclosure. The comparative package structure PKO illustrated in FIG. 12 is similar to the package structure PK1 illustrated in FIG. 2F, hence the same reference numerals are used to refer to the same or liked parts, and its detailed description will be omitted herein. The difference between the embodiments is that the first spacer structures 40 are omitted from the package structure PKO.

Referring to FIG. 12, in some comparative embodiments, since there are no spacer structures located in between the lid structure 520 and the circuit substrate 200, the applied force during the attachment of the lid structure 520 onto the circuit substrate 200 is controlled with difficulty. As such, the package structure PKO may suffer many problems such as delamination and non-uniform arrangements of the thermal interface material 510 and the adhesive material ADM. For example, in some embodiments, when excessive force is applied during the attachment of the lid structure 520, the thermal interface material 510 may be squeezed out and cover sidewalls of the semiconductor package SM causing reliability issues. Similarly, the adhesive material ADM may tend to bleed toward adjacent passive devices PDX and potentially damage the passive devices PDX.

Figure 13:
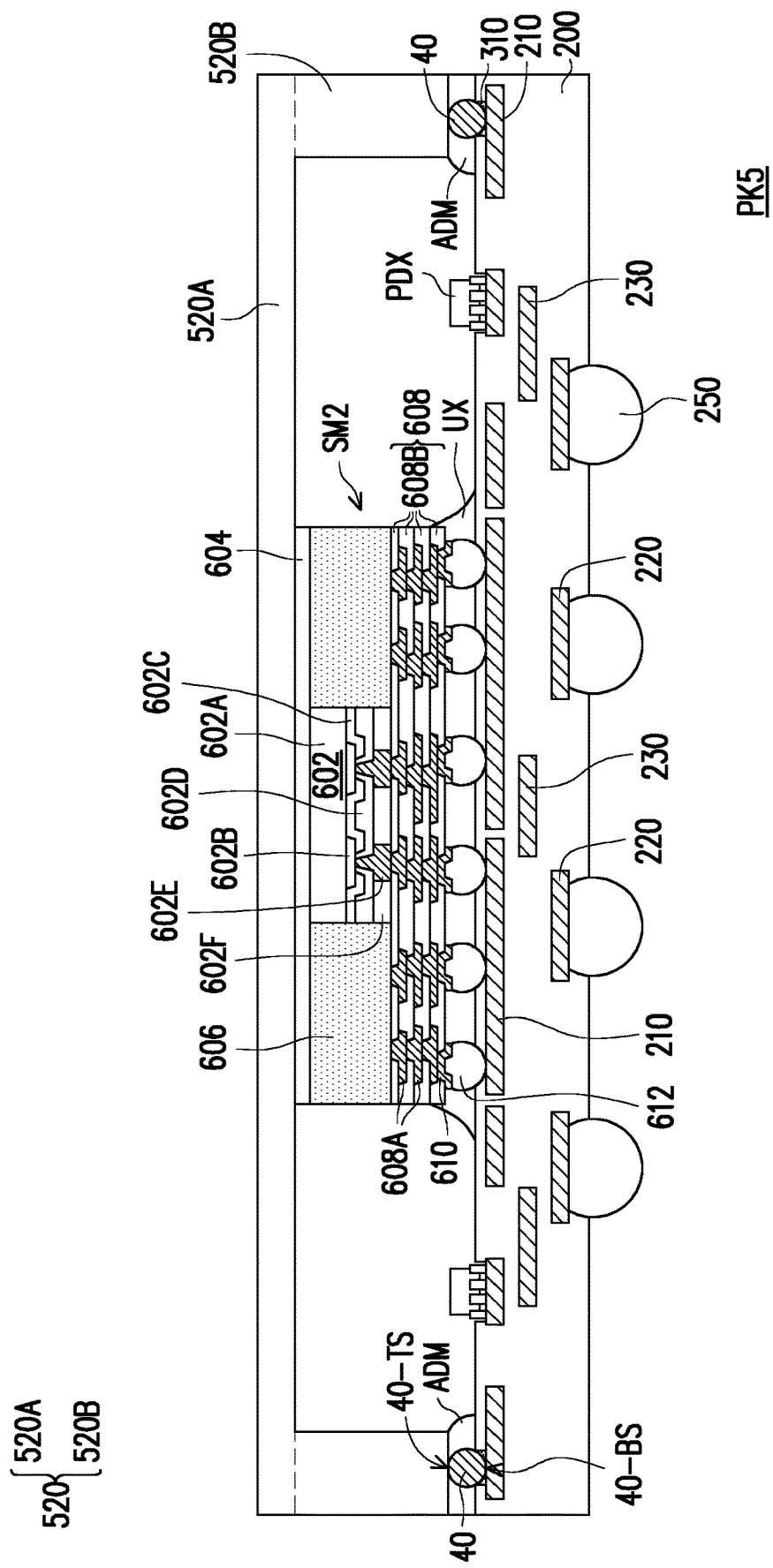
FIG. 13 is a package structure according to some other exemplary embodiments of the present disclosure.

FIG. 13 is a package structure according to some other exemplary embodiments of the present disclosure. The package structure PK5 illustrated in FIG. 13 is similar to the package structure PK1 illustrated in FIG. 2F, hence the same reference numerals are used to refer to the same or liked parts, and its detailed description will be omitted herein. The difference between the embodiments is in the design of the semiconductor package. As illustrated in FIG. 2F, the semiconductor package SM is directed to a chip-on-wafer (CoW) package. However, the disclosure is not limited thereto. For example, referring to FIG. 13, a semiconductor package SM2 is provided in replacement of the semiconductor package SM shown in FIG. 2F.

In the exemplary embodiment, the semiconductor package SM2 includes a semiconductor die 602, a dielectric layer 604, an insulating encapsulant 606, a redistribution layer 608, conductive pads 610 and conductive balls 612. The semiconductor die 602 is located on a dielectric layer 604. The insulating encapsulant 606 is located on the dielectric layer 604 and surrounding the semiconductor die 602. In some embodiments, the semiconductor die 602 includes a semiconductor substrate 602A, a plurality of conductive pads 602B, a passivation layer 602C, a post passivation layer 602D, a plurality of conductive posts or conductive vias 602E, and a protection layer 602F. As illustrated in FIG. 13, the plurality of conductive pads 602B is disposed on the semiconductor substrate 602A. The passivation layer 602C is formed over the semiconductor substrate 602A and has openings that partially expose the conductive pads 602B on the semiconductor substrate 602A. The semiconductor substrate 602A may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 602B may be aluminum pads, copper pads or other suitable metal pads. The passivation layer 602C may be a silicon oxide layer, a silicon nitride layer, a silicon oxy-nitride layer or a dielectric layer formed of any suitable dielectric materials.

Furthermore, in some embodiments, the post-passivation layer 602D is optionally formed over the passivation layer 602C. The post-passivation layer 602D covers the passivation layer 602C and has a plurality of contact openings. The conductive pads 602B are partially exposed by the contact openings of the post passivation layer 602D. The post-passivation layer 602D may be a benzocyclobutene (BCB) layer, a polyimide layer, a polybenzoxazole (PBO) layer, or a dielectric layer formed by other suitable polymers. In some embodiments, the conductive posts or conductive vias 602E are formed on the conductive pads 602B by plating. In some embodiments, the protection layer 602F is formed on the post passivation layer 602D covering the conductive posts or conductive vias 602E so as to protect the conductive posts or conductive vias 602E. Although only one semiconductor die 602 is illustrated herein, however, it should be noted that the disclosure is not limited thereto, and the number of semiconductor die 602 in the semiconductor package SM2 can be more than one.

Furthermore, as illustrated in FIG. 13, the redistribution layer 608 is formed on the insulating encapsulant 606 and electrically connected to the semiconductor die 602. In some embodiments, the formation of the redistribution layer 608 includes sequentially forming one or more dielectric layers 608B, and one or more metallization layers 608A in alternation. In certain embodiments, the metallization layers 608A are sandwiched between the dielectric layers 608B. Although only three layers of the metallization layers 608A and four layers of dielectric layers 608B are illustrated herein, however, the scope of the disclose is not limited by the embodiments of the disclosure. In other embodiments, the number of metallization layers 608A and the dielectric layers 608B may be adjusted based on product requirement. In some embodiments, the metallization layers 608A are electrically connected to the conductive posts 602E of the semiconductor dies 602.

In some embodiments, a plurality of conductive pads 610 is disposed on an exposed top surface of the topmost layer of the metallization layers 608A for electrically connecting with conductive balls. In certain embodiments, the conductive pads 610 are for example, under-ball metallurgy (UBM) patterns used for ball mount. As shown in FIG. 13, the conductive pads 610 are formed on and electrically connected to the redistribution layer 608. In some embodiments, the materials of the conductive pads 610 may include copper, nickel, titanium, tungsten, or alloys thereof or the like, and may be formed by an electroplating process, for example. The number of conductive pads 610 are not limited in this disclosure, and may be selected based on the design layout. In some alternative embodiments, the conductive pads 610 may be omitted. In other words, conductive balls 612 formed in subsequent steps may be directly disposed on the redistribution layer 608.

As illustrated in FIG. 13, a plurality of conductive balls 612 is disposed on the conductive pads 608 and over the redistribution layer 610. In some embodiments, the conductive balls 612 may be disposed on the conductive pads 610 by a ball placement process or reflow process. In some embodiments, the conductive balls 612 are, for example, solder balls or ball grid array (BGA) balls. In some embodiments, the conductive balls 612 are connected to the redistribution layer 608 through the conductive pads 610. In certain embodiments, some of the conductive balls 612 may be electrically connected to the semiconductor die 602 through the redistribution layer 608. The number of the conductive balls 612 is not limited to the disclosure, and may be designated and selected based on the number of the conductive pads 610.

In the exemplary embodiment, the semiconductor package SM2 is disposed on the circuit substrate 300 by flip-chip bonding. In some embodiments, the semiconductor package SM2 is electrically connected to the contact pads 210 of the circuit substrate 200 through the conductive balls 612. In certain embodiments, the conductive balls 612 are further protected by the underfill structure UX. Similar to the embodiments above, since first spacer structure 40 are located in between the lid structure 520 and the circuit substrate 200, a problem of delamination and non-uniform arrangements of the adhesive material ADM, as well as squeeze out and bleeding of the adhesive material ADM can be prevented.

In the above-mentioned embodiments, the package structure includes a plurality of first spacer structures sandwiched between the lid structure and the circuit substrate. As such, an applied force when attaching the lid structure to the circuit substrate can be appropriately controlled. For example, problems caused by a low applied force (thick thermal interface material causing high thermal resistance) or excessive applied force (squeeze out and bleeding of materials) during attachment of the lid structure, and other related problems such as delamination and non-uniform arrangements of the thermal interface material and adhesives may be prevented. Overall, a package structure with better reliability can be obtained.

In accordance with some embodiments of the present disclosure, a package structure includes a circuits substrate, a semiconductor package, a lid structure and a plurality of first spacer structures. The semiconductor package is disposed on and electrically connected to the circuit substrate. The lid structure is disposed on the circuit substrate covering the semiconductor package, wherein the lid structure is attached to the circuit substrate through an adhesive material. The plurality of first spacer structures is surrounding the semiconductor package, wherein the first spacer structures are sandwiched between the lid structure and the circuit substrate, and includes a top portion in contact with the lid structure and a bottom portion in contact with the circuit substrate.

In accordance with some other embodiments of the present disclosure, a package structure includes a circuit substrate, an interposer structure, a plurality of semiconductor dies, a lid structure, a thermal interface material and a plurality of first spacer structures. The interposer structure is disposed on the circuit substrate and electrically connected to the circuit substrate. The semiconductor dies are disposed on the interposer structure and electrically connected to the interposer structure. The lid structure is e disposed on the circuit substrate, wherein the lid structure comprises a cover portion located over the plurality of semiconductor dies and sidewall portions joined with the cover portion and surrounding the plurality of semiconductor dies and the interposer structure, and the sidewall portions are attached to the circuit substrate through an adhesive material. The thermal interface material is disposed in between the plurality of semiconductor dies and the cover portion of the lid structure. The plurality of first spacer structures is disposed in between the circuit substrate and the sidewall portions of the lid structure adjacent to the adhesive material.

In accordance with yet another embodiment of the present disclosure, a method of fabricating a package structure is described. The method includes the following steps. A circuit substrate is provided. A plurality of first spacer structures is placed on the circuit substrate, wherein the plurality of first spacer structures includes a top portion and a bottom portion, and the bottom portion is in contact with the circuit substrate. A semiconductor package is disposed onto the circuit substrate within an area surrounded by the first spacer structures. A lid structure is attached onto the circuit substrate through an adhesive material, wherein the lid structure surrounds the semiconductor package, the plurality of first spacer structures is sandwiched between the lid structure and the circuit substrate, and the lid structure is in contact with the top portion of the plurality of first spacer structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a circuit substrate;
   a semiconductor package disposed on and electrically connected to the circuit substrate;
   a lid structure disposed on the circuit substrate covering the semiconductor package, wherein the lid structure is attached to the circuit substrate through an adhesive material; and
   a plurality of first spacer structures surrounding the semiconductor package and separated from the semiconductor package, wherein the plurality of first spacer structures is sandwiched between the lid structure and the circuit substrate, and includes a top portion in physical contact with the lid structure and a bottom portion in physical contact with the circuit substrate.

2. The package structure according to claim 1, wherein the circuit substrate comprises a plurality of openings that exposes conductive pads of the circuit substrate, and the plurality of first spacer structures is disposed within the plurality of openings and connected to the conductive pads.

3. The package structure according to claim 1, further comprising a plurality of second spacer structures surrounding the plurality of first spacer structures, wherein the plurality of second spacer structures is sandwiched between the lid structure and the circuit substrate, and includes a top portion in contact with the lid structure and a bottom portion in contact with the circuit substrate.

4. The package structure according to claim 3, wherein the adhesive material is located in between the plurality of first spacer structures and the plurality of second spacer structures, and spaced apart from the plurality of first spacer structures and the plurality of second spacer structures.

5. The package structure according to claim 3, wherein the adhesive material covers and contacts the plurality of first spacer structures and the plurality of second spacer structures.

6. The package structure according to claim 3, wherein the adhesive material covers one of the plurality of first spacer structures or the plurality of second spacer structures, and is spaced apart from another one of the plurality of first spacer structures or the plurality of second spacer structures.

7. The package structure according to claim 1, wherein each of the plurality of first spacer structures is a ball structure, a core-shell structure or a pillar structure.

8. A package structure, comprising:
   a circuit substrate;
   an interposer structure disposed on the circuit substrate and electrically connected to the circuit substrate;
   a plurality of semiconductor dies disposed on the interposer structure and electrically connected to the interposer structure;
   a lid structure disposed on the circuit substrate, wherein the lid structure comprises a cover portion located over the plurality of semiconductor dies and sidewall portions joined with the cover portion and surrounding the plurality of semiconductor dies and the interposer structure, and the sidewall portions are attached to the circuit substrate through an adhesive material, wherein a ratio (W1:Dx) of a width W1 of the sidewall portions to a distance Dx in between the circuit substrate and the sidewall portions is in a range of 10:1 to 30:1;
   a thermal interface material disposed in between the plurality of semiconductor dies and the cover portion of the lid structure; and
   a plurality of first spacer structures disposed in between the circuit substrate and the sidewall portions of the lid structure adjacent to the adhesive material.

9. The package structure according to claim 8, wherein the circuit substrate comprises a plurality of openings that exposes conductive pads of the circuit substrate, and the plurality of first spacer structures is disposed within the plurality of openings and connected to the conductive pads.

10. The package structure according to claim 8, wherein the plurality of first spacer structures is attached on dielectric layers of the circuit substrate.

11. The package structure according to claim 8, further comprising a plurality of second spacer structures surrounding the plurality of first spacer structures, wherein the plurality of second spacer structures is disposed in between the circuit substrate and the sidewall portions of the lid structure adjacent to the adhesive material.

12. The package structure according to claim 11, wherein the adhesive material is located in between the plurality of first spacer structures and the plurality of second spacer structures, and spaced apart from the plurality of first spacer structures and the plurality of second spacer structures.

13. The package structure according to claim 11, wherein the adhesive material covers at least one of the plurality of first spacer structures and the plurality of second spacer structures.

14. The package structure according to claim 11 wherein the plurality of first spacer structures and the plurality of second spacer structures are arranged in a zig-zag manner on the circuit substrate and surrounding the interposer structure.

15. The package structure according to claim 8, wherein each of the plurality of first spacer structures is a ball structure, a core-shell structure or a pillar structure.

16. A method of fabricating a package structure, comprising:
   providing a circuit substrate;
   placing a plurality of first spacer structures on the circuit substrate, wherein the plurality of first spacer structures includes a top portion and a bottom portion, and the bottom portion is in physical contact with the circuit substrate;
   disposing a semiconductor package onto the circuit substrate within an area surrounded by the plurality of first spacer structures, wherein the plurality of first spacer structures is separated from the semiconductor package; and
   attaching a lid structure onto the circuit substrate through an adhesive material, wherein the lid structure surrounds the semiconductor package, the plurality of first spacer structures is sandwiched between the lid structure and the circuit substrate, and the lid structure is in physical contact with the top portion of the plurality of first spacer structures.

17. The method according to claim 16, further comprising:
   forming a plurality of first openings and a plurality of second openings on the circuit substrate;
   disposing solder pastes within the plurality of first openings and the plurality of second openings;
   placing the plurality of first spacer structures within the plurality of second openings of the circuit substrate;
   disposing the semiconductor package onto the circuit substrate by disposing a plurality of conductive terminals of the semiconductor package within the plurality of first openings of the circuit substrate; and performing a reflow process joining the plurality of first spacer structures with the circuit substrate and joining the plurality of conductive terminals with the circuit substrate.

18. The method according to claim 16, further comprising:

forming a plurality of first openings and a plurality of second openings on the circuit substrate;

placing the plurality of first spacer structures within the plurality of second openings of the circuit substrate, and using an adhesive to join the plurality of first spacer structures with the circuit substrate;

disposing solder pastes within the plurality of first openings; and disposing the semiconductor package onto the circuit substrate by disposing a plurality of conductive terminals of the semiconductor package within the plurality of first openings of the circuit substrate, and performing a reflow process to join the plurality of conductive terminals with the circuit substrate.

19. The method according to claim 16, wherein placing the plurality of first spacer structures on the circuit substrate comprises:

forming a mixture by mixing the plurality of first spacer structures with the adhesive material and dispensing the mixture on the circuit substrate;

attaching the lid structure onto the circuit substrate by pressing the lid structure onto the mixture so that the lid structure is attached to the circuit substrate through the adhesive material, and wherein the plurality of first spacer structures is sandwiched between the lid structure and the circuit substrate.

20. The method according to claim 16, further comprising:

placing a plurality of second spacer structures on the circuit substrate surrounding the plurality of first spacer structures; and attaching the lid structure onto the circuit substrate through the adhesive material so that the plurality of second spacer structures is sandwiched between the lid structure and the circuit substrate.

* * * * *